United States Patent
Yu et al.

(10) Patent No.: US 11,061,769 B2
(45) Date of Patent: Jul. 13, 2021

(54) STORAGE DEVICE SELECTIVELY GENERATING PARITY BITS ACCORDING TO ENDURANCE OF MEMORY CELL, AND METHOD THEREOF

(71) Applicant: SAMSUNG ELECTRONICS CO., LTD., Suwon-si (KR)

(72) Inventors: Jae-Duk Yu, Seoul (KR); Jin-Young Kim, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/851,434

(22) Filed: Apr. 17, 2020

(65) Prior Publication Data

US 2021/0089394 A1    Mar. 25, 2021

(30) Foreign Application Priority Data

Sep. 20, 2019 (KR) .................. 10-2019-0115842

(51) Int. Cl.
| | | |
|---|---|---|
| *G11C 29/00* | (2006.01) | |
| *G06F 11/10* | (2006.01) | |
| *G11C 29/52* | (2006.01) | |
| *G11C 16/34* | (2006.01) | |
| *G11C 13/00* | (2006.01) | |
| *G11C 16/04* | (2006.01) | |

(52) U.S. Cl.
CPC ...... *G06F 11/1068* (2013.01); *G11C 13/0004* (2013.01); *G11C 13/0035* (2013.01); *G11C 16/0483* (2013.01); *G11C 16/3495* (2013.01); *G11C 29/52* (2013.01)

(58) Field of Classification Search
CPC . G06F 11/1068; G11C 29/52; G11C 16/3495; G11C 13/0035; G11C 16/0483
See application file for complete search history.

(56) References Cited

U.S. PATENT DOCUMENTS

| | | |
|---|---|---|
| 8,250,282 B2 | 8/2012 | Confalonieri et al. |
| 8,924,638 B2 | 12/2014 | Carannante et al. |
| 9,164,832 B2 | 10/2015 | Gaertner et al. |
| 9,262,268 B2 | 2/2016 | Cai et al. |
| 9,274,885 B2 | 3/2016 | Qawami et al. |
| 9,619,408 B2 | 4/2017 | Nale et al. |
| 10,133,625 B2 | 11/2018 | Bandic et al. |
| 2013/0170296 A1* | 7/2013 | Yun .............. G11C 16/349 365/185.09 |
| 2016/0371026 A1* | 12/2016 | Shim ............... G11C 16/16 |
| 2017/0046221 A1* | 2/2017 | Bandic ............ G06F 11/1044 |
| 2017/0116076 A1* | 4/2017 | Sharma .......... G06F 11/1068 |
| 2019/0205257 A1* | 7/2019 | Kim ............... G06F 12/0246 |

* cited by examiner

Primary Examiner — Samir W Rizk
(74) Attorney, Agent, or Firm — Lee IP Law, PC

(57) ABSTRACT

A storage device includes a first nonvolatile memory chip; a second nonvolatile memory chip; and a controller. The controller may include a processor configured to execute a flash translation layer (FTL) loaded onto an on-chip memory; an ECC engine configured to generate first parity bits for data and to selectively generate second parity bits for the data, under control of the processor; and a nonvolatile memory interface circuit configured to transmit the data and the first parity bits to the first nonvolatile memory chip, and to selectively transmit the second parity bits selectively generated to the second nonvolatile memory chip.

20 Claims, 15 Drawing Sheets

STORAGE DEVICE SELECTIVELY GENERATING PARITY BITS ACCORDING TO ENDURANCE OF MEMORY CELL, AND METHOD THEREOF

CROSS-REFERENCE TO RELATED APPLICATION

Korean Patent Application No. 10-2019-0115842, filed on Sep. 20, 2019, in the Korean Intellectual Property Office, and entitled: "Storage Device Selectively Generating Parity Bits According to Endurance of Memory Cell," is incorporated by reference herein in its entirety.

BACKGROUND

1. Field

Embodiments relate to a storage device selectively generating parity bits depending on endurance of a memory cell and an operating method thereof.

2. Description of the Related Art

Parity bits based on an error correction code may be used to correct an error that occurs at data stored in a memory cell. As the number of parity bits increases, the error correction capacity may be reinforced.

SUMMARY

Embodiments are directed to a storage device, including a first nonvolatile memory chip; a second nonvolatile memory chip; and a controller. The controller may include a processor to execute a flash translation layer (FTL) loaded onto an on-chip memory; an ECC engine to generate first parity bits for data and to selectively generate second parity bits for the data, under control of the processor; and a nonvolatile memory interface circuit to transmit the data and the first parity bits to the first nonvolatile memory chip, and to selectively transmit the second parity bits selectively generated to the second nonvolatile memory chip.

Embodiments are also directed to a storage device, including a first nonvolatile memory chip; a second nonvolatile memory chip; and a controller including a processor and an ECC engine. The ECC engine may generate first parity bits for data to be stored in the first nonvolatile memory chip, and may selectively generate second parity bits for the data, under control of the processor, and the processor may selectively allocate an area, in which the second parity bits selectively generated are to be stored, to the second nonvolatile memory chip.

Embodiments are also directed to a method of operating a storage device including a first nonvolatile memory chip, a second nonvolatile memory chip, and a controller, the method including checking, by the controller, a program-erase (PE) cycle of memory cells of the first nonvolatile memory chip, in which first parity bits for the data are stored; and selectively generating, by the controller, second parity bits for the data to be stored in the second nonvolatile memory chip, in addition to the first parity bits, depending on the PE cycle.

BRIEF DESCRIPTION OF THE FIGURES

Features will become apparent to those of skill in the art by describing in detail example embodiments with reference to the attached drawings in which.

DETAILED DESCRIPTION

Figure 1:
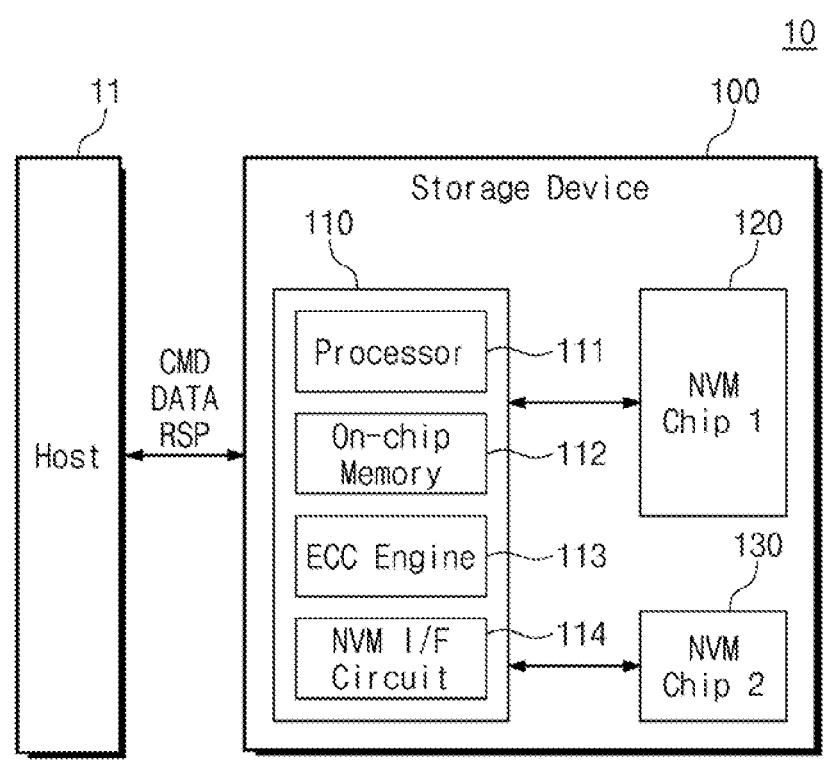
FIG. 1 illustrates a block diagram of an electronic device according to an example embodiment.

FIG. 1 illustrates a block diagram of an electronic device according to an example embodiment.

Referring to FIG. 1, an electronic device 10 according to an example embodiment may be a personal computer, a server, a workstation, a notebook, a tablet, a mobile device, or a smartphone and may be referred to as a "computing system", an "electronic system", or a "mobile system". The electronic device 10 may include a host 11 and a storage device 100.

The host 11 may transmit a command CMD to the storage device 100. The host 11 may exchange data "DATA" with the storage device 100. The host 11 may receive a response RSP to the command CMD from the storage device 100. The host 11 may be implemented to include one or more processor cores. For example, the host 11 may include a general-purpose processor, a special-purpose processor, or an application processor. The host 11 may be a processor itself or may be an electronic device or a system including a processor.

The storage device 100 may communicate with the host 11 in compliance with one or more interface protocols. For example, the storage device 100 may be a solid state drive (SSD), an embedded memory integrated in the electronic device 10, a memory card removable from the electronic device 10, a secure digital (SD) card, an embedded multimedia card (eMMC), a universal flash storage (UFS) card, etc.

The storage device 100 may include a controller 110, a first nonvolatile memory device (NVM) chip 120, and a second NVM chip 130.

The controller 110 may process the command CMD and may transmit the response RSP indicating a processing result to the host 11. The controller 110 may access the first NVM chip 120 or the second NVM chip 130 based on the command CMD. The controller 110 may include a processor 111, an on-chip memory 112, an error correction code (ECC) engine 113, and an NVM interface (I/F) circuit 114.

The processor 111 may control the on-chip memory 112, the ECC engine 113, and the NVM I/F circuit 114. The processor 111 may include one or more cores (e.g., a homogeneous multi-core or a heterogeneous multi-core). The processor 111 may be or include, for example, at least one of a central processing unit (CPU), an image signal processing unit (ISP), a digital signal processing unit (DSP), a graphics processing unit (GPU), a vision processing unit (VPU), and a neural processing unit (NPU). The processor 111 may execute various application programs (e.g., a flash translation layer (FTL) and firmware) loaded onto the on-chip memory 112.

The on-chip memory 112 may store various application programs that are executable by the processor 111. The on-chip memory 112 may operate as a cache memory adjacent to the processor 111. The on-chip memory 112 may store a command, an address, and data to be processed by the processor 111 or may store a processing result of the processor 111. The on-chip memory 112 may be, for example, a storage medium or a working memory including a latch, a register, a static random access memory (SRAM), a dynamic random access memory (DRAM), a thyristor random access memory (TRAM), a tightly coupled memory (TCM), etc.

The ECC engine 113 may perform an ECC operation (or ECC encoding) on data to be programmed (or written) in the first NVM chip 120 or the second NVM chip 130 under control of the processor 111. The ECC engine 113 may perform an ECC operation (or ECC decoding) on data read from the first NVM chip 120 or the second NVM chip 130 under control of the processor 111. The ECC engine 113 may perform ECC operations (or ECC encoding and ECC decoding) based on various ECCs such as an LDPC (Low Density Parity Check) code, a BCH (Bose-Chaudhuri-Hocquengh) code, a turbo code, a Reed-Solomon code, a convolution code, and an RSC (Recursive Systematic) code.

The NVM I/F circuit 114 may access the first NVM chip 120 or the second NVM chip 130 under control of the processor 111 and in compliance with various interface protocols such as a toggle double data rate (DDR). The NVM I/F circuit 114 may drive at least one channel connected to the first NVM chip 120 or the second NVM chip 130. The NVM I/F circuit 114 may transmit data to be stored to the first NVM chip 120 or the second NVM chip 130 or may receive data read from the first NVM chip 120 or the second NVM chip 130.

The first NVM chip 120 may store data transmitted from the controller 110 or may transmit data stored therein to the controller 110. The second NVM chip 130, which is separate from the first NVM chip 120, may store data transmitted from the controller 110 or may transmit data stored therein to the controller 110. As compared to the example illustrated in FIG. 1, the first NVM chip 120 may be implemented with one or more NVM chips, and the second NVM chip 130 may be implemented with one or more NVM chips.

In an example embodiment, the endurance and/or reliability of a memory cell of the second NVM chip 130 may be higher than the endurance and/or reliability of a memory cell of the first NVM chip 120. An index or metric of the endurance of a memory cell may be a maximum program-erase (PE) cycle. The maximum PE cycle may indicate the maximum number of events, in each of which a memory cell is written from a program state to an erase state and is again written to a program state, during which the memory cell normally operates (i.e., until the maximum PE cycle). The maximum PE cycle of the memory cell of the second NVM chip 130 may be greater than the maximum PE cycle of the memory cell of the first NVM chip 120.

In an example embodiment, an order of magnitude of the maximum PE cycle of the memory cell of the second NVM chip 130 may be greater than an order of magnitude of the maximum PE cycle of the memory cell of the first NVM chip 120. For example, the order of magnitude of the maximum PE cycle of the memory cell of the second NVM chip 130 may be, e.g., $M=2^{20}$ or more, while the order of magnitude of the maximum PE cycle of the memory cell of the first NVM chip 120 may be, e.g., $M=2^{10}$ or more.

The controller 110 may change data stored in the second NVM chip 130 relatively more frequently than data stored in the first NVM chip 120 or may store various kinds of data in the second NVM chip 130. The lifetime of the memory cell of the second NVM chip 130 may be longer than the lifetime of the memory cell of the first NVM chip 120.

In addition to exhibiting a relatively higher endurance of a memory cell, a data input/output speed of the second NVM chip 130 may be higher than a data input/output speed of the first NVM chip 120. Also, a data input/output unit of the second NVM chip 130 may be greater than a data input/output unit of the first NVM chip 120. For example, the second NVM chip 130 may support overwrite, while the first NVM chip 120 may not support overwrite. Also, a program (or read) unit and an erase unit of the first NVM chip 120 may be different. A capacity of the second NVM chip 130 may be, for example, smaller than a capacity of the first NVM chip 120.

Each of the first NVM chip 120 and the second NVM chip 130 may be, for example, one of a NOR flash memory chip, a NAND flash memory chip, a resistive random access memory (RRAM) chip, a ferroelectric random access memory (FRAM) chip, a phase change random access memory (PRAM) chip, a magnetic random access memory (MRAM) chip, etc. A kind of the first NVM chip 120 and a kind of the second NVM chip 130 may be identical or may be different from each other. For example, the first NVM chip 120 may be a NAND flash memory chip including a memory cell (e.g., a multi-level cell (MLC), a triple level cell (TLC), or a quad level cell (QLC)) storing two or more bits, and the second NVM chip 130 may be a NAND flash memory chip including a memory cell (e.g., a single level cell) storing one bit. The number of bits stored in the memory cell of the first NVM chip 120 may be more than the number of bits stored in the memory cell of the second NVM chip 130. For another example, the first NVM chip 120 may be a NAND flash memory chip, and the second NVM chip 130 may be a PRAM chip.

The controller 110 may store data transmitted from the host 11 in the first NVM chip 120 as main data. The controller 110 may store spare data (e.g., parity bits being an ECC encoding result) to be used to correct an error of the main data in the first NVM chip 120. Here, the spare data may be referred to as "additional data" or "ECC data for error correction".

The controller 110 may store data except for the above main data and spare data in the second NVM chip 130, not the first NVM chip 120. For example, the controller 110 may allocate an area to be used for garbage collection of the first NVM chip 120 to the second NVM chip 130, may allocate an over-provisioning area incapable of being used or accessed by the host 11 to the second NVM chip 130, and may store meta data of the FTL (e.g., an address mapping table AMP (refer to FIGS. 2A to 2D) storing address mapping between a logical address of the host 11 and a physical address of the first NVM chip 120 or the second NVM chip 130) in the second NVM chip 130. The term "area" may indicate a set of memory cells where data of the same kind or similar kinds are stored.

In an example embodiment, the controller 110 may further store the spare data, which are used to correct an error of main data stored in the first NVM chip 120, in both the first NVM chip 120 and the second NVM chip 130.

For example, in the case where the first NVM chip 120 is relatively less used and the endurance of the first NVM chip 120 is relatively high, the controller 110 may store spare data only in the first NVM chip 120 and may correct an error of the main data only by using the spare data stored in the first NVM chip 120. However, where the first NVM chip 120 is relatively more used and the endurance of the first NVM chip 120 is relatively low (or is degraded), it may be impossible to correct an error of the main data only by using the spare data stored in the first NVM chip 120. Since the error correction capability of the ECC engine 113 may be improved as the size of spare data increases, the controller 110 may further generate second spare data to be stored in the second NVM chip 130 (in addition to first spare data to be stored in the first NVM chip 120), and may store the first spare data in the first NVM chip 120 and the second spare data in the second NVM chip 130. The controller 110 may correct an error of main data by using both the first spare data stored in the first NVM chip 120 and the second spare data stored in the second NVM chip 130. Here, the terms "first" and "second" may be used to identify whether spare data are stored in any NVM chip 120 or 130, and the first spare data and the second spare data may be collectively referred to as "spare data".

As compared to the example illustrated in FIG. 1, the storage device 100 may not include the second NVM chip 130. The size of the first NVM chip 120 may be determined such that main data and spare data are stored together, for reinforcing the error correction capacity of the ECC engine 113 in consideration of the endurance to be degraded. Due to the latency between the controller 110 and the first NVM chip 120, the controller 110 may issue a program command once and may program main data and spare data in adjacent memory cells (e.g., memory cells belonging to the same page or memory cells connected to one word line) of the first NVM chip 120. Also, the controller 110 may issue a read command once and may read the main data and the spare data stored in the adjacent memory cells of the first NVM chip 120. When the size of the spare data increases to reinforce the error correction capacity of the ECC engine 113, the size of the first NVM chip 120 may be correspondingly increased by as much as the increased size of the spare data.

According to an example embodiment, the controller 110 may store second spare data that is selectively generated depending on the endurance of the first NVM chip 120 in the second NVM chip 130. In the case that the storage device 100 includes the second NVM chip 130, the size of the first NVM chip 120 may be determined such that the main data and the first spare data are stored together. As described above, when the endurance of the first NVM chip 120 is relatively high, the controller 110 may store the first spare data only in the first NVM chip 120 and may correct an error of the main data by using only the first spare data. When the endurance of the first NVM chip 120 is relatively low, the controller 110 may store the first spare data in the first NVM chip 120 and the second spare data in the second NVM chip 130 and may correct an error of the main data by using the first spare data and the second spare data.

When the controller 110 does not generate spare data (e.g., depending on the endurance of the first NVM chip 120), the controller 110 may store data (except for the main data and the first spare data stored in the first NVM chip 120) in the second NVM chip 130. When the controller 110 generates spare data depending on the endurance of the first NVM chip 120, the controller 110 may store data (except for the main data and the first spare data stored in the first NVM chip 120) in the second NVM chip 130 together with the second spare data.

In an example embodiment, the controller 110 may adjust or change the size of the second spare data depending on the endurance of the first NVM chip 120. The controller 110 may dynamically use the second NVM chip 130 by variously adjusting, changing, or updating data to be stored in the second NVM chip 130 depending on the endurance of the first NVM chip 120.

Various embodiments in which the second NVM chip 130 is dynamically used will be described below.

FIGS. 2A to 2D illustrate block diagrams of a storage device of FIG. 1.

In FIGS. 2A to 2D, each of storage devices 100a to 100d is an example of the storage device 100 of FIG. 1, each of first NVM chips 120a to 120d is an example of the first NVM chip 120 of FIG. 1, and each of second NVM chips 130a to 130d is an example of the second NVM chip 130 of FIG. 1.

In FIGS. 2A to 2D, with regard to components having the same reference numerals as components illustrated in FIG. 1, additional description will be omitted to avoid redundancy.

The processor 111 may execute the FTL loaded onto the on-chip memory 112. The FTL may be loaded onto the on-chip memory 112 as firmware or a program stored in the first NVM chip 120 or the second NVM chip 130. The FTL may be present between a file system of the host 11 and the first NVM chip 120. The FTL may manage mapping between a logical address provided from the host 11 and a physical address of the first NVM chip 120 and may include an address mapping table manager managing and updating an address mapping table AMT. The FTL may further perform a garbage collection operation, a wear leveling operation, and the like, as well as the address mapping described above. The FTL may be executed by the processor 111 for addressing one or more of the following aspects of the first NVM chip 120: overwrite- or in-place write-impossible, a lifetime of a memory cell, a limited number of program-erase (PE) cycles, and an erase speed slower than a write speed.

The FTL may include a PE cycle checker and an erase-program interval (EPI) checker. The PE cycle checker may count or check a PE cycle of a first block BLK1 of the first NVM chip 120a. The first NVM chip 120a may include one or more blocks (not illustrated), and the PE cycle checker may count or check a PE cycle of each of the one or more blocks of the first NVM chip 120a (or a PE cycle per block). The PE cycle may be an event in which a memory cell is written from a program state to an erase state and is again written to a program state. The PE cycle may be used as a measurement unit of the endurance of the first block BLK1 of the first NVM chip 120a. The PE cycle checker may, for example, generate and update the PE cycle table PET including a PE cycle counted per block.

The EPI checker may check an EP interval of the first block BLK1 of the first NVM chip 120a. As in the above description, the first NVM chip 120a may include one or more blocks (not illustrated), and the EPI checker may check an EP interval of each of the one or more blocks of the first NVM chip 120a (or an EP cycle per block). The EP interval may indicate an interval from a time when a memory cell is erased to a time when the memory cell is programmed. The EP interval may be used as a measurement unit or metric of the endurance of the first block BLK1 of the first NVM chip 120a. The EPI checker may, for example, generate and update an EPI table (not illustrated) including an EP interval per block.

In an example embodiment, each of the address mapping table manager, the PE cycle checker, and the EPI checker (which are components of the FTL) may be loaded onto the on-chip memory 112 and may be executed by the processor 111. In another example embodiment, at least a part of the address mapping table manager, the PE cycle checker, and the EPI checker may be implemented within the controller 110 in the form of hardware, software, or a combination of hardware and software.

The FTL may include both the PE cycle (PEC) checker and the EPI checker, as illustrated in FIGS. 2A to 2D, or the FTL may include only one of the PE cycle checker and the EPI checker, and the processor 111 may dynamically use the second NVM chip 130a with reference to at least one of the PE cycle and the EP interval. Below, a description will be given of the processor 111 dynamically using the second NVM chip 130a depending on a PE cycle. In an implementation, the processor 111 may dynamically use the second NVM chip 130a depending on an index (e.g., a PE cycle, an EP interval, and a temperature) of the first NVM chip 120a or a combination of two or more of the indexes. In the case where the processor 111 dynamically uses the second NVM chip 130a depending on a temperature, the controller 110 may further include a temperature sensor (not illustrated) configured to sense a temperature or may receive temperature information from the first NVM chip 120. In an implementation, the processor 111 may check the endurance of the first NVM chip 120a further with reference to a temperature and may dynamically use the second NVM chip 130a.

Figure 2A:
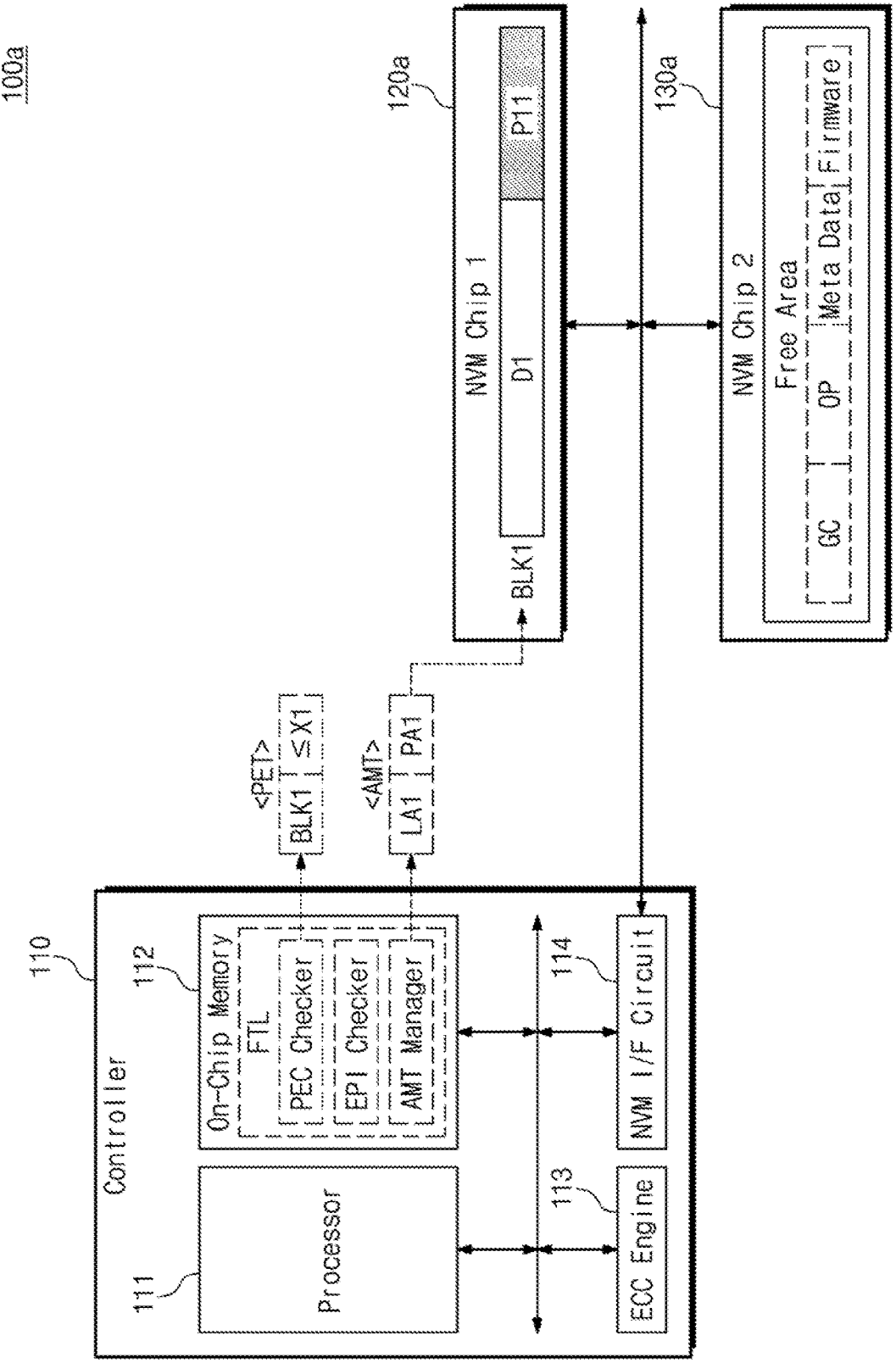
FIGS. 2A to 2D illustrate block diagrams of a storage device of FIG. 1.

In FIG. 2A, the controller 110 may receive a program command, a logical address LA1, and data D1, and may perform a program operation of programming (or writing) the data D1 in the first block BLK1 of the first NVM chip 120a. The processor 111 may check that the PE cycle (or a PE cycle count) of the first block BLK1 is X1 or less (or less than X1), with reference to the PE cycle table PET of the PE cycle checker. Here, "X1" may be a threshold value (or a reference value) and may be determined in advance. A PE cycle of X1 or less may indicate that the endurance of the first block BLK1 is relatively high. Depending on the PE cycle (or PE cycle count) of X1 or less, the processor 111 may determine that the first spare data are programmed only in the first NVM chip 120a and the second spare data are not programmed in the second NVM chip 130a. The first spare data may be used to correct an error of the data D1, and the second spare data may be selectively used to correct the error of the data D1. The address mapping table manager may update the address mapping table AMT by mapping the logical address LA1 onto a physical address PA1 of the first NVM chip 120a. The physical address PA1 may indicate an area of the first NVM chip 120a where the data D1 and parity bits P11 will be stored (e.g., may indicate some memory cells of the block BLK1).

Under control of the processor 111, the ECC engine 113 may perform an ECC encoding operation on the data D1 and may generate the parity bits P11 corresponding to the first spare data. The NVM I/F circuit 114 may transmit a program command, the physical address PA1, the data D1, and the parity bits P11 to the first NVM chip 120a. The physical address PA1 may indicate the memory cells of the first block BLK1 where the data D1 and the parity bits P11 will be stored.

In FIG. 2A, the processor 111 may determine that the second spare data are not programmed in the second NVM chip 130a. The processor 111 may variously use the second NVM chip 130a rather than programming the second spare data in the second NVM chip 130a. For example, the processor 111 may designate the second NVM chip 130a as an area for garbage collection of the FTL, as an over-provisioning area, as an area in which meta data of the FTL will be stored, or as an area where firmware will be stored. All the above areas may be included in a free area as illustrated in FIG. 2A, or at least a part of the above areas may be included in the free area (different from the example illustrated in FIG. 2A).

Figure 2B:
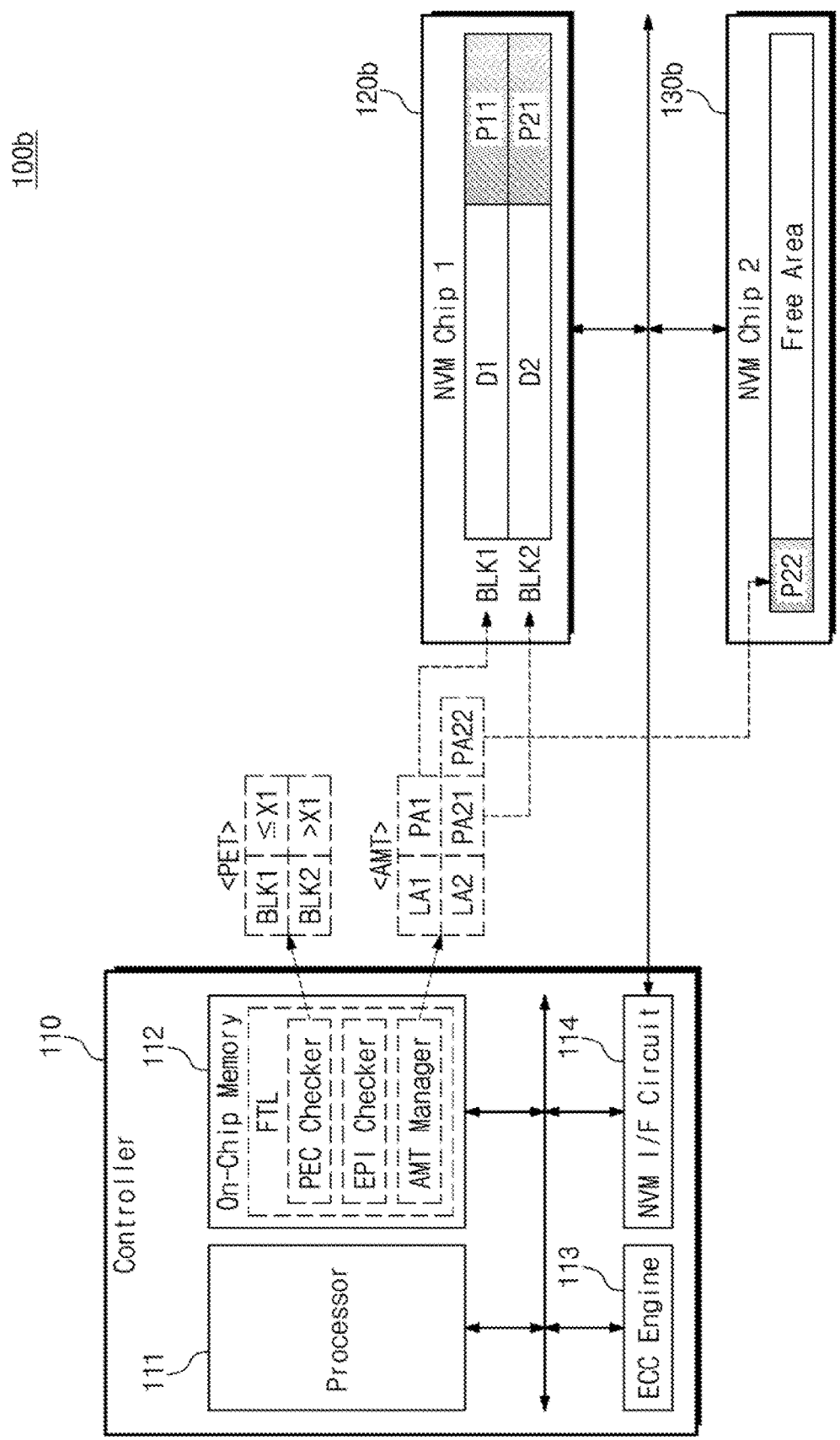

According to the program operation of FIG. 2A, the data D1 and the parity bits P11 may be programmed in the first block BLK1 of the first NVM chip 120a. In FIG. 2B, the controller 110 may further receive a program command, a logical address LA2, and data D2 and may further perform a program operation of programming (or writing) the data D2 in a second block BLK2 of the first NVM chip 120b.

The processor 111 may check whether a PE cycle (or a PE cycle count) of the second block BLK2 exceeds X1 (or X1 or more), with reference to the PE cycle table PET of the PE cycle checker. The PE cycle exceeding X1 may indicate that the endurance of the second block BLK2 is relatively low, and the endurance of the second block BLK2 may be lower than the endurance of the first block BLK1. Depending on whether the PE cycle (or PE cycle count) exceeds X1, the processor 111 may determine that the first spare data are programmed in the first NVM chip 120b and the second spare data are also programmed in the second NVM chip 130b. The address mapping table manager may update the address mapping table AMT by mapping the logical address LA2 onto a physical address PA21 of the first NVM chip 120b and a physical address PA22 of the second NVM chip 130b. The physical address PA21 may indicate an area of the first NVM chip 120b where the data D2 and parity bits P21 will be stored (e.g., may indicate some memory cells of the block BLK2). The physical address PA22 may indicate an area of the second NVM chip 130b where parity bits P22 will be stored.

Under control of the processor 111, the ECC engine 113 may perform an ECC encoding operation on the data D2 and may generate the parity bits P21 corresponding to the first spare data and the parity bits P22 corresponding to the second spare data. In an example embodiment, the size of the parity bits P11 and the size of the parity bits P21 may be equal (e.g., a same number of parity bits), and the size of the parity bits P22 may be smaller (e.g., a smaller number of parity bits) than the size of the parity bits P21. The processor 111 may reinforce the error correction capacity for the data D2 compared with the error correction capacity for the data D1 by increasing the total size, e.g., total number, of the parity bits P21 and P22 used for error correction of the data D2 compared with the size, e.g., number, of the parity bits P11 used for error correction of the data D1.

The NVM I/F circuit 114 may transmit a program command, the physical address PA21, the data D2, and the parity bits P21 to the first NVM chip 120b. The physical address PA21 may indicate the memory cells of the second block BLK2 where the data D2 and the parity bits P21 will be stored. The NVM I/F circuit 114 may transmit a program command, the physical address PA22, and the parity bits P22 to the second NVM chip 130b. The physical address PA22 may indicate memory cells where the parity bits P22 will be stored.

The total number of memory cells of the second NVM chip 130b (i.e., the capacity of the second NVM chip 130b) may be determined in advance and may be fixed. The processor 111 may allocate a partial area of the free area of the second NVM chip 130a of FIG. 2A to an area where the parity bits P22 will be stored. Referring to FIGS. 2A and 2B together, depending on a PE cycle (or a PE cycle count) of the block BLK1/BLK2 where the data D1/D2 will be stored, the processor 111 may selectively generate parity bits (P22 in the case of D2) and may selectively allocate an area for storing the parity bits P22 to the second NVM chip 130b. The processor 111 may determine whether to generate the parity bits P22 and whether to allocate an area for storing the parity bits P22, depending on a PE cycle. The NVM I/F circuit 114 may selectively transmit the parity bits P22 to the second NVM chip 130b depending to whether the parity bits P22 are generated.

As the area for storing the parity bits P22 is allocated, the size (or capacity) of the free area of the second NVM chip 130a may decrease to the size of the free area of the second NVM chip 130b. For example, the decrement may correspond to the size of the parity bits P22. Depending on the PE cycle of the block BLK1/BLK2 where the data D1/D2 will be stored, the processor 111 may dynamically adjust or allocate the size of the free area of the second NVM chip 130a/130b and the size of the area for storing the parity bits P22 at the same time. When the parity bits P22 are not generated, the processor 111 may switch or set the area for storing the parity bits P22 to the free area of FIG. 2A.

Figure 2C:
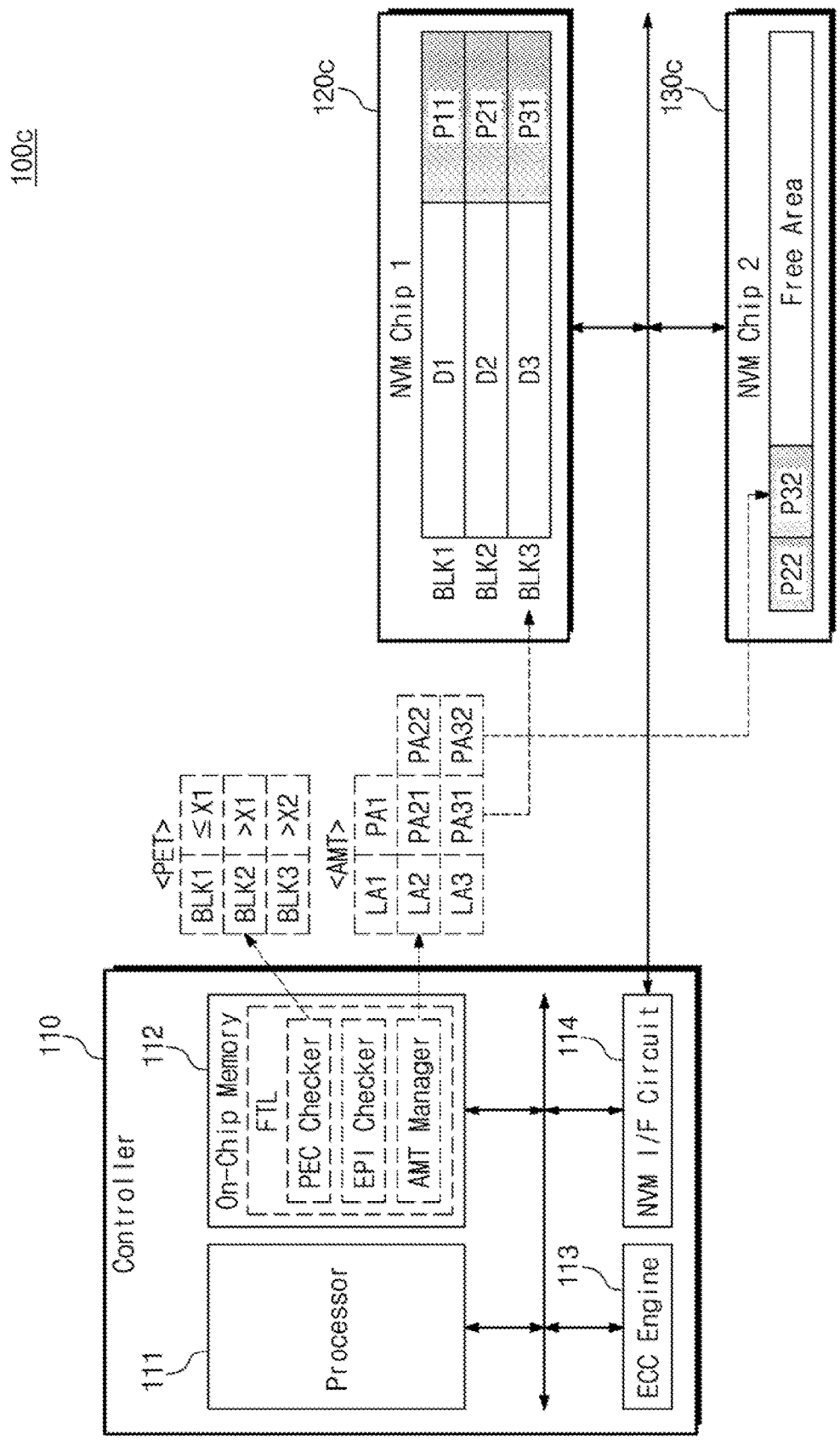

According to the program operations of FIGS. 2A and 2B, the data D1 and the parity bits P11 may be programmed in the first block BLK1 of the first NVM chip 120c, the data D2 and the parity bits P21 may be programmed in the second block BLK2 of the first NVM chip 120c, and the parity bits P22 may be programmed in the second NVM chip 130c. As shown in FIG. 2C, the controller 110 may further receive a program command, a logical address LA3, and data D3, and may further perform a program operation of programming the data D3 in a third block BLK3 of the first NVM chip 120c.

The processor 111 may check whether a PE cycle of the third block BLK3 exceeds X2 (or X2 or more). For example, "X2" may be greater than "X1". The endurance of the third block BLK3 having the PE cycle exceeding X2 may be lower than the endurance of the second block BLK2. Depending on the PE cycle exceeding X2, the processor 111 may determine that the first spare data are programmed in the first NVM chip 120c and the second spare data are also programmed in the second NVM chip 130c. To reinforce the error correction capacity for the data D3 to be stored in the third block BLK3 (the endurance of which may be lower than that of the second block BLK2), the processor 111 may determine the size of the second spare data for the data D3 to be greater than the size of the second spare data for the data D2. The address mapping table manager may update the address mapping table AMT by mapping the logical address LA3 onto a physical address PA31 of the first NVM chip 120c and a physical address PA32 of the second NVM chip 130c. The physical address PA31 may indicate an area of the first NVM chip 120c where the data D3 and parity bits P31 will be stored (e.g., may indicate some memory cells of the block BLK3). The physical address PA32 may indicate an area of the second NVM chip 130c where the parity bits P32 will be stored.

Under control of the processor 111, the ECC engine 113 may perform an ECC encoding operation on the data D3, and may generate the parity bits P31 corresponding to the first spare data and the parity bits P32 corresponding to the second spare data. In an example embodiment, the size of the parity bits P31 and the size of the parity bits P21 may be equal, and the size of the parity bits P32 may be smaller than the size of the parity bits P31. The size of the parity bits P32 may be greater than the size of the parity bits P22. The processor 111 may reinforce the error correction capacity for the data D3 compared with the error correction capacity for the data D2 by increasing the total size of the parity bits P31 and P32 used for error correction of the data D3 compared with the total size of the parity bits P21 and P22 used for error correction of the data D2.

The NVM I/F circuit 114 may transmit a program command, the physical address PA31, the data D3, and the parity bits P31 to the first NVM chip 120c. The physical address PA31 may indicate the memory cells of the second block BLK3 where the data D3 and the parity bits P31 will be stored. The NVM I/F circuit 114 may transmit a program command, the physical address PA32, and the parity bits P32 to the second NVM chip 130c. The physical address PA22 may indicate memory cells where the parity bits P32 will be stored.

The processor 111 may allocate a partial area of the free area of the second NVM chip 130b of FIG. 2B to an area where the parity bits P32 will be stored. Referring to FIGS. 2A to 2C, as the area for storing the parity bits P32 is allocated, the size of the free area of the second NVM chip 130b may decrease to the size of the free area of the second NVM chip 130c. For example, the decrement may correspond to the size of the parity bits P32. Depending on the PE cycle of the block BLK1/BLK2/BLK3 where the data D1/D2/D3 will be stored, the processor 111 may dynamically adjust the free area of the second NVM chip 130a/130b/130c and may dynamically adjust the area for storing the parity bits P22 and P32 at the same time.

Figure 2D:
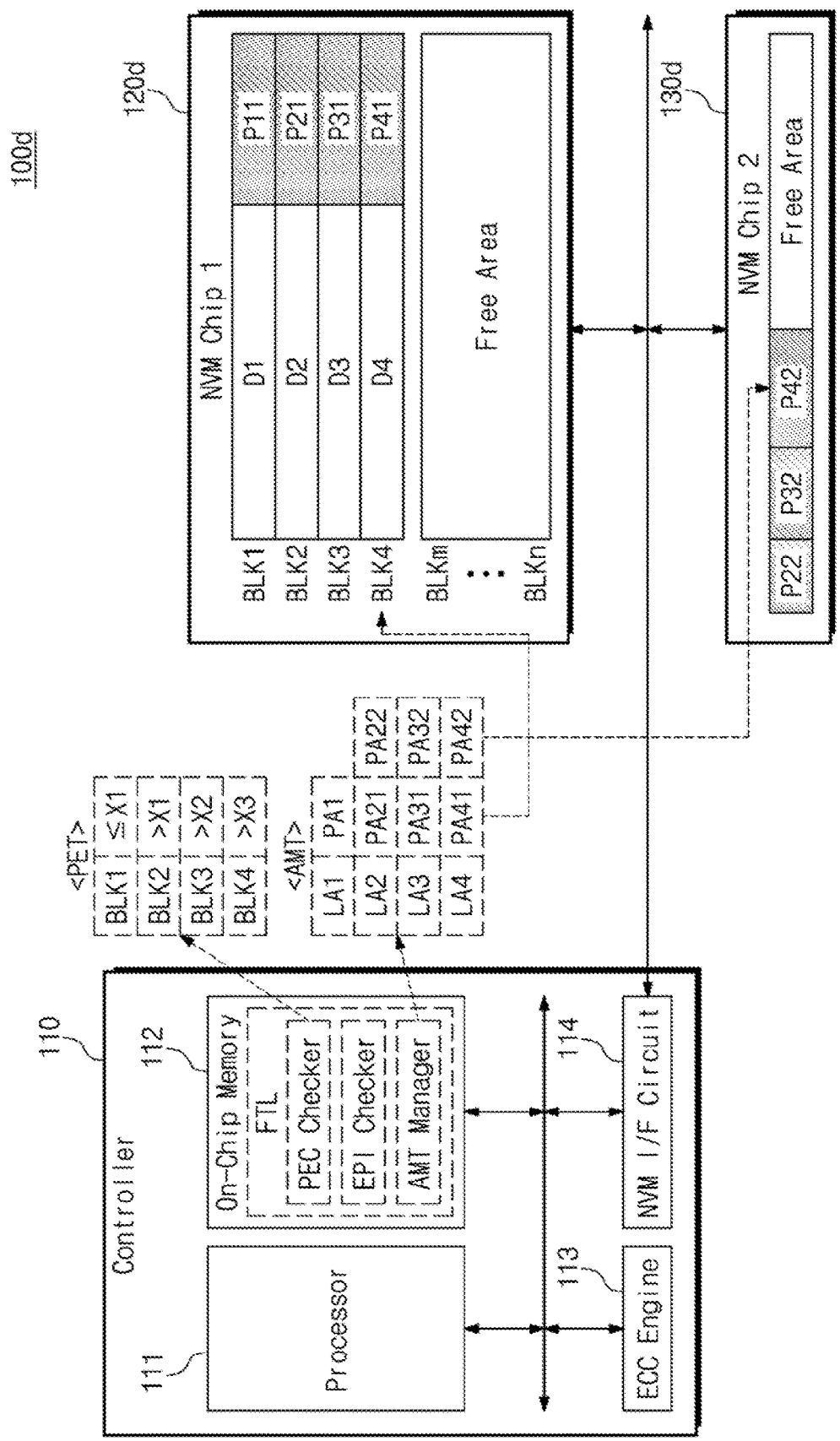

According to the program operations of FIGS. 2A to 2C, the data D1 and the parity bits P11 may be programmed in the first block BLK1 of the first NVM chip 120d, the data D2 and the parity bits P21 may be programmed in the second block BLK2 of the first NVM chip 120d, the data D3 and the parity bits P31 may be programmed in the third block BLK3 of the first NVM chip 120d, and the parity bits P22 and P32 may be programmed in the second NVM chip 130d. As shown in FIG. 2D, the controller 110 may further receive a program command, a logical address LA4, and data D4 and may further perform a program operation of programming the data D4 in a fourth block BLK4 of the first NVM chip 120d.

The processor 111 may check whether a PE cycle of the fourth block BLK4 exceeds X3 (or X3 or more). X3 may be, for example, greater than X2. The endurance of the fourth block BLK4 having the PE cycle exceeding X3 may be lower than the endurance of the third block BLK3. Depending on the PE cycle exceeding X3, the processor 111 may determine that the first spare data are programmed in the first NVM chip 120d and the second spare data are also programmed in the second NVM chip 130d. To reinforce the error correction capacity for the data D4 to be stored in the fourth block BLK4 (the endurance of which may be lower than that of the third block BLK3), the processor 111 may determine the size of the second spare data for the data D4 to be greater than the size of the second spare data for the data D3. The address mapping table manager may update the address mapping table AMT by mapping the logical address LA4 onto a physical address PA41 of the first NVM chip 120d and a physical address PA42 of the second NVM chip 130d. The physical address PA41 may indicate an area of the first NVM chip 120d where the data D4 and parity bits P41 will be stored (e.g., may indicate some memory cells of the block BLK4). The physical address PA42 may indicate an area of the second NVM chip 130d where the parity bits P42 will be stored.

Under control of the processor 111, the ECC engine 113 may perform an ECC encoding operation on the data D4, and may generate the parity bits P41 corresponding to the first spare data and the parity bits P42 corresponding to the second spare data. In an example embodiment, the size of the parity bits P41 and the size of the parity bits P21 may be equal, and the size of the parity bits P42 may be smaller than the size of the parity bits P41. In an example embodiment, the size of the parity bits P42 may be greater than the size of the parity bits P42. The processor 111 may reinforce the error correction capacity for the data D4 compared with the error correction capacity for the data D3 by increasing the total size of the parity bits P41 and P42 used for error correction of the data D4 compared with the total size of the parity bits P31 and P32 used for error correction of the data D3.

The NVM I/F circuit 114 may transmit a program command, the physical address PA41, the data D4, and the parity bits P41 to the first NVM chip 120d. The physical address PA41 may indicate the memory cells of the fourth block BLK4 where the data D4 and the parity bits P41 will be stored. The NVM I/F circuit 114 may transmit a program command, the physical address PA42, and the parity bits P42 to the second NVM chip 130d. The physical address PA42 may indicate memory cells where the parity bits P42 will be stored.

The processor 111 may allocate a partial area of the free area of the second NVM chip 130c of FIG. 2C to an area where the parity bits P42 will be stored. Referring to FIGS. 2A to 2D, depending on the PE cycle of the block BLK1/BLK2/BLK3/BLK4 where the data D1/D2/D3/D4 will be stored, the processor 111 may dynamically adjust the free area of the second NVM chip 130a/130b/130c/130d, and may dynamically adjust the area for storing the parity bits P22, P32, and P42 at the same time. For example, as the free area of the second NVM chip 130b/130c/130d decreases due to the increase in the size of the parity bits P22, P32, and P42, the processor 111 may designate at least one block BLKm to BLKn ("m" and "n" being a natural number of 1 or more) of the first NVM chip 120d as the free area.

In an example embodiment, the size of the parity bits P22, the size of the parity bits P32, and the size of the parity bits P42 may be different from each other. For example, the size of the parity bits P22/P32/P42 may be 10% or more of the size of the parity bits PP21/P31/P41. The size of the parity bits P22, the size of the parity bits P32, and the size of the parity bits P42 may be equal to each other. Each of the size of the parity bits P22, the size of the parity bits P32, and the size of the parity bits P42 may be determined based on a fixed ratio of the size of the data D1/D2/D3/D4.

The processor 111 may compare the PE cycle of the block BLK1/BLK2/BLK3/BLK4 and a threshold value X1/X2/X3. The processor 111 may determine whether to generate the parity bits P22/P32/P42 and/or the size of the parity bits P22/P32/P42 based on a comparison result. The number of threshold values X1 to X3 may vary relative to the examples illustrated in FIGS. 2A to 2D, and may be one or more. As the number of threshold values increases, the processor 111 may further subdivide and manage the endurance of the first NVM chip 120, and may further subdivide and adjust the size of the parity bits P22/P32/P42. As described above with regard to the PE cycle, the processor 111 may compare another index (e.g., an EP interval or a temperature) indicating the endurance of the block BLK1/BLK2/BLK3/BLK4 with a threshold value, and may determine whether to generate the parity bits P22/P32/P42 or the size of the parity bits P22/P32/P42 based on a comparison result.

Figure 3A:
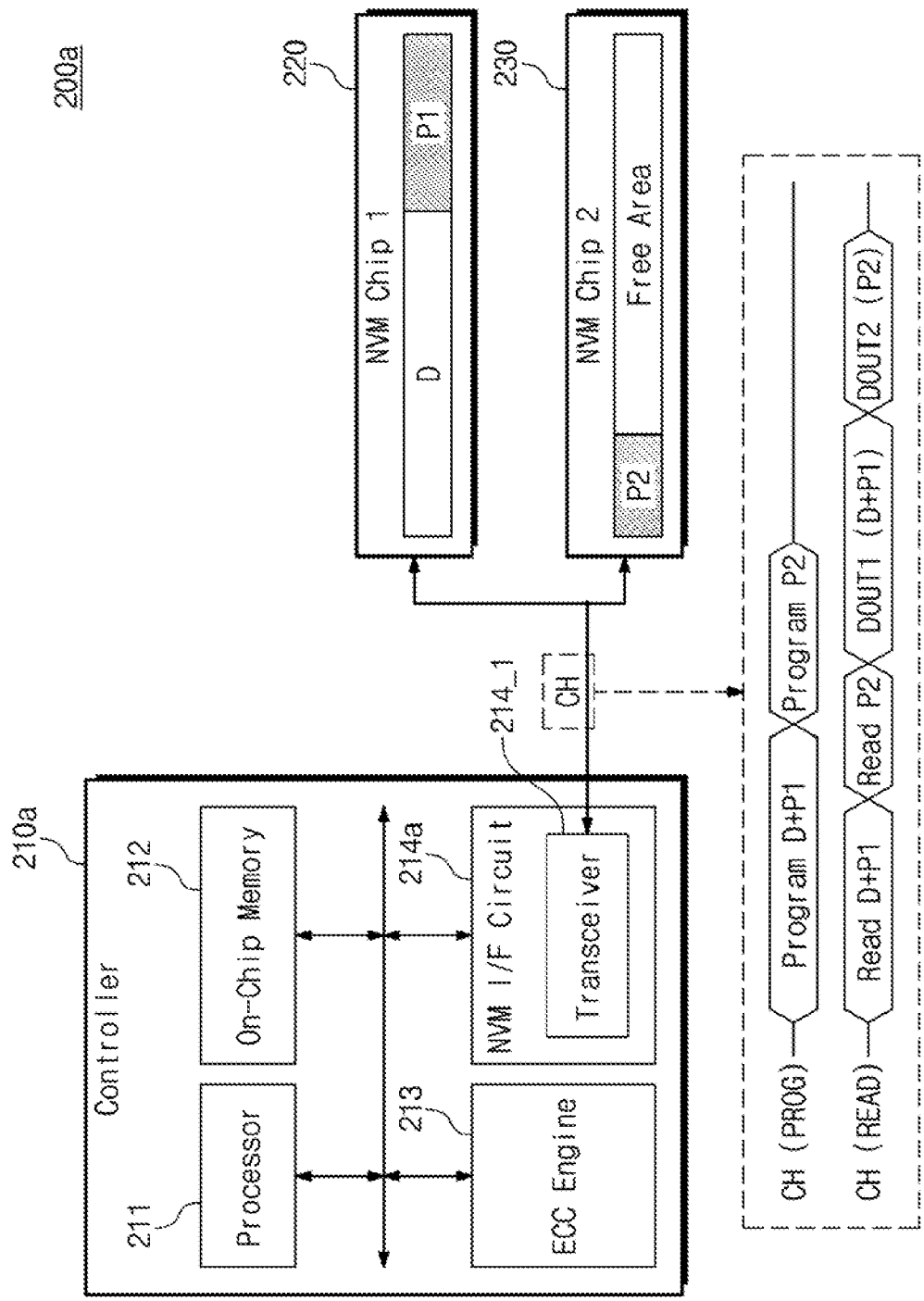
FIGS. 3A and 3B illustrate block diagrams of a storage device of FIG. 1.
Figure 3B:
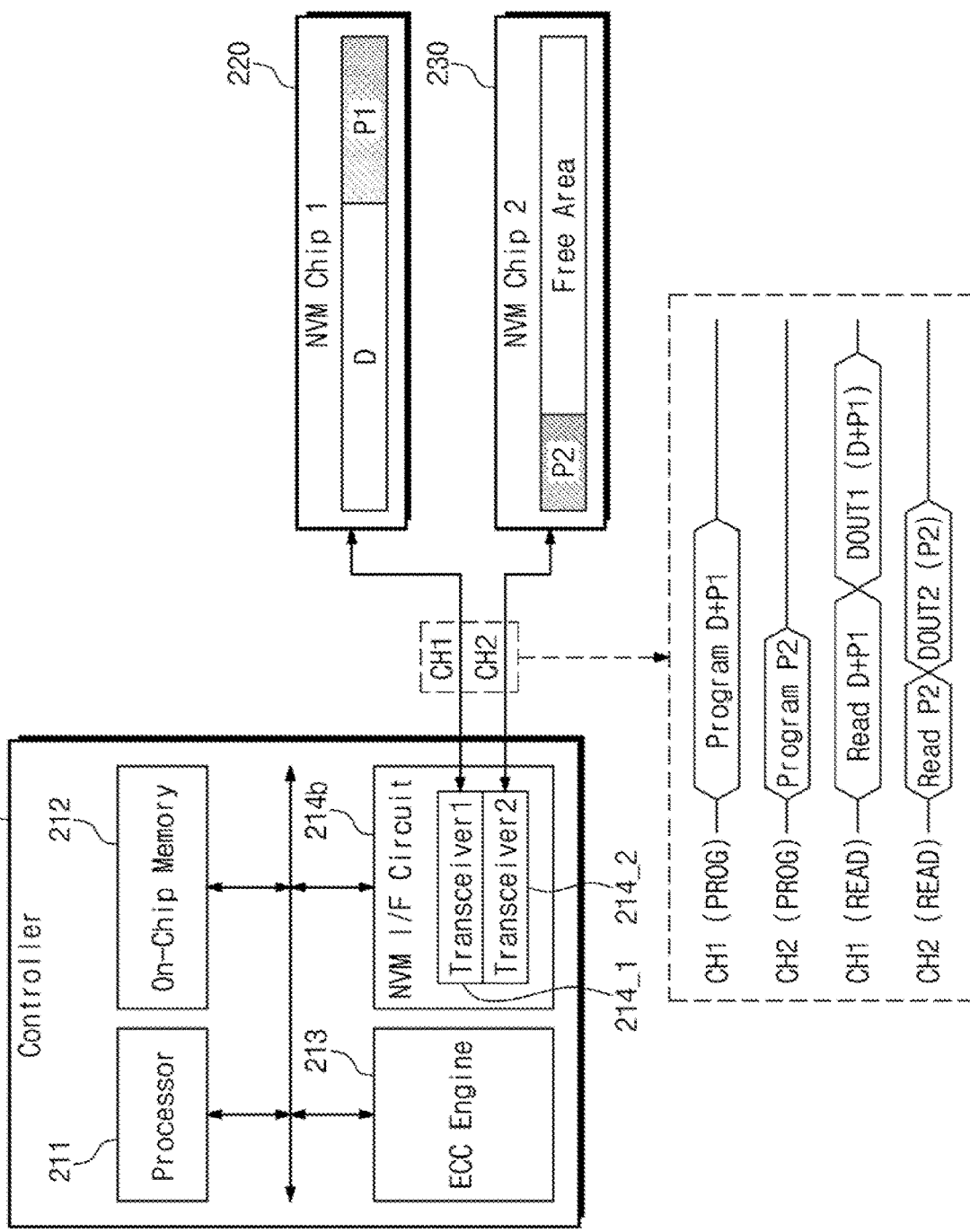

FIGS. 3A and 3B illustrate block diagrams of a storage device of FIG. 1.

Each of storage devices 200a and 200b is an example of the storage device 100 of FIG. 1, a first NVM chip 220 is an example of the first NVM chip 120 of FIG. 1, and a second NVM chip 230 is an example of the second NVM chip 130 of FIG. 1.

In FIGS. 3A and 3B, with regard to components having the same reference numerals as the components illustrated in FIGS. 1 and 2A to 2D, additional description will be omitted to avoid redundancy.

Data "D" of the first NVM chip 220 may indicate one of the pieces of data D1 to D4 of FIGS. 2A to 2D, parity bits P1 of the first NVM chip 220 may indicate the parity bits P11, the parity bits P21, the parity bits P31, or the parity bits P41 described with reference to FIGS. 2A to 2D, and parity bits P2 of the second NVM chip 230 may indicate the parity bits P22, the parity bits P32, or the parity bits P42 described with reference to FIGS. 2B to 2D.

Configurations and operations of components 211 to 213 of a controller 210a/210b may be substantially identical to the configurations and the operations of the processor 111, the on-chip memory 112, and the ECC engine 113 of the controller 110 described above. A NVM I/F circuit 214a of the controller 210a may include a transceiver 214_1 driving a channel CH. The first NVM chip 220 and the second NVM chip 230 may be connected in common to the channel CH.

The data "D" and the parity bits P1 and P2 may be programmed in the first and second NVM chips 220 and 230 through the channel CH. The transceiver 214_1 may transmit a program command, an address indicating an area where the data "D" and the parity bits P1 will be programmed, the data "D", and the parity bits P1 to the first NVM chip 220 through the channel CH. Afterwards, the transceiver 214_1 may transmit a program command, an address indicating an area where the parity bits P2 will be programmed, and the parity bits P2 to the second NVM chip 230 through the channel CH. In an example embodiment, a program latency of the second NVM chip 230 may be shorter than a program latency of the first NVM chip 220. In this case, while the data "D" and the parity bits P1 are programmed in the first NVM chip 220, as illustrated in FIG. 3A, the transceiver 214_1 may transmit the program command, the address, and the parity bits P2 to the second NVM chip 230. In an implementation, different from the example illustrated in FIG. 3A, the transceiver 214_1 may transmit information to the first NVM chip 220 after completely transmitting information to the second NVM chip 230. In an implementation, the transceiver 214_1 may transmit information to the second NVM chip 230 in an interleaving scheme while transmitting information to the first NVM chip 220.

The data "D" and the parity bits P1 and P2 may be read from the first and second NVM chips 220 and 230 through the channel CH. The transceiver 214_1 may transmit a read command and an address indicating an area where the data "D" and the parity bits P1 are programmed to the first NVM chip 220 through the channel CH. Afterwards, the transceiver 214_1 may transmit a read command and an address indicating an area where the parity bits P2 are programmed to the second NVM chip 230 through the channel CH. In an example embodiment, a read latency of the second NVM chip 230 may be shorter than a read latency of the first NVM chip 220. In this case, while the data "D" and the parity bits P1 are read from the first NVM chip 220, as illustrated in FIG. 3A, the transceiver 214_1 may transmit information to the second NVM chip 230. Of course, unlike the example illustrated in FIG. 3A, the transceiver 214_1 may transmit information to the first NVM chip 220 after completely transmitting information to the second NVM chip 230. The transceiver 214_1 may receive output data DOUT1 (including the data "D" and the parity bits P1) through the channel CH. The transceiver 214_1 may receive output data DOUT2 (including the parity bits P2) through the channel CH. The order of receiving the output data DOUT1 and DOUT2 is not limited to the example illustrated in FIG. 10. In an implementation, the transceiver 214_1 may transmit information to the second NVM chip 230 in an interleaving scheme while transmitting information to the first NVM chip 220. In an implementation, the transceiver 214_1 may receive the output data DOUT2 in an interleaving scheme while receiving the output data DOUT1.

The NVM I/F circuit 214b of the controller 210b may include the first transceiver 214_1 driving a first channel CH1, and a second transceiver 214_2 driving a second channel CH2. The first NVM chip 220 and the second NVM chip 230 may be connected to the first channel CH1 and the second channel CH2, respectively.

The first transceiver 214_1 may transmit a program command, an address indicating an area where the data "D" and the parity bits P1 will be programmed, the data "D", and the parity bits P1 to the first NVM chip 220 through the first channel CH1. The second transceiver 214_2 may transmit a program command, an address indicating an area where the parity bits P2 will be programmed, and the parity bits P2 to the second NVM chip 230 through the second channel CH2. The first transceiver 214_1 may transmit a read command and an address indicating an area where the data "D" and the parity bits P1 are programmed to the first NVM chip 220 through the first channel CH1. Afterwards, the first transceiver 214_1 may receive the output data DOUT1 (including the data "D" and the parity bits P1) through the first channel CH1. The second transceiver 214_2 may transmit a read command and an address indicating an area where the parity bits P2 are programmed to the second NVM chip 230 through the second channel CH2. Afterwards, the second transceiver 214_2 may receive the output data DOUT2 (including the parity bits P2) through the second channel CH2.

The NVM I/F circuit 214a/214b of FIGS. 3A and 3B may communicate with the first and second NVM chips 220 and 230 through at least one channel, e.g., independent of the number of channels. The NVM I/F circuit 214a/214b may receive the data "D" provided from the host 11 and the parity bits P1 and P2 generated by the ECC engine 213 and may transmit the data "D" and the parity bits P1 to the first NVM chip 220 and the parity bits P2 to the second NVM chip 230. The NVM I/F circuit 214a/214b may divide the parity bits P1 and P2 into the parity bits P1 and the parity bits P2. The NVM I/F circuit 214a/214b may receive the data "D" and the parity bits P1 and P2 from the first and second NVM chips 220 and 230 and may provide the data "D" and the parity bits P1 and P2 to the on-chip memory 212 or the ECC engine 213. The NVM I/F circuit 214a/214b may combine the parity bits P2 and the parity bits P2 to constitute the parity bits P1 and P2.

Figure 4A:
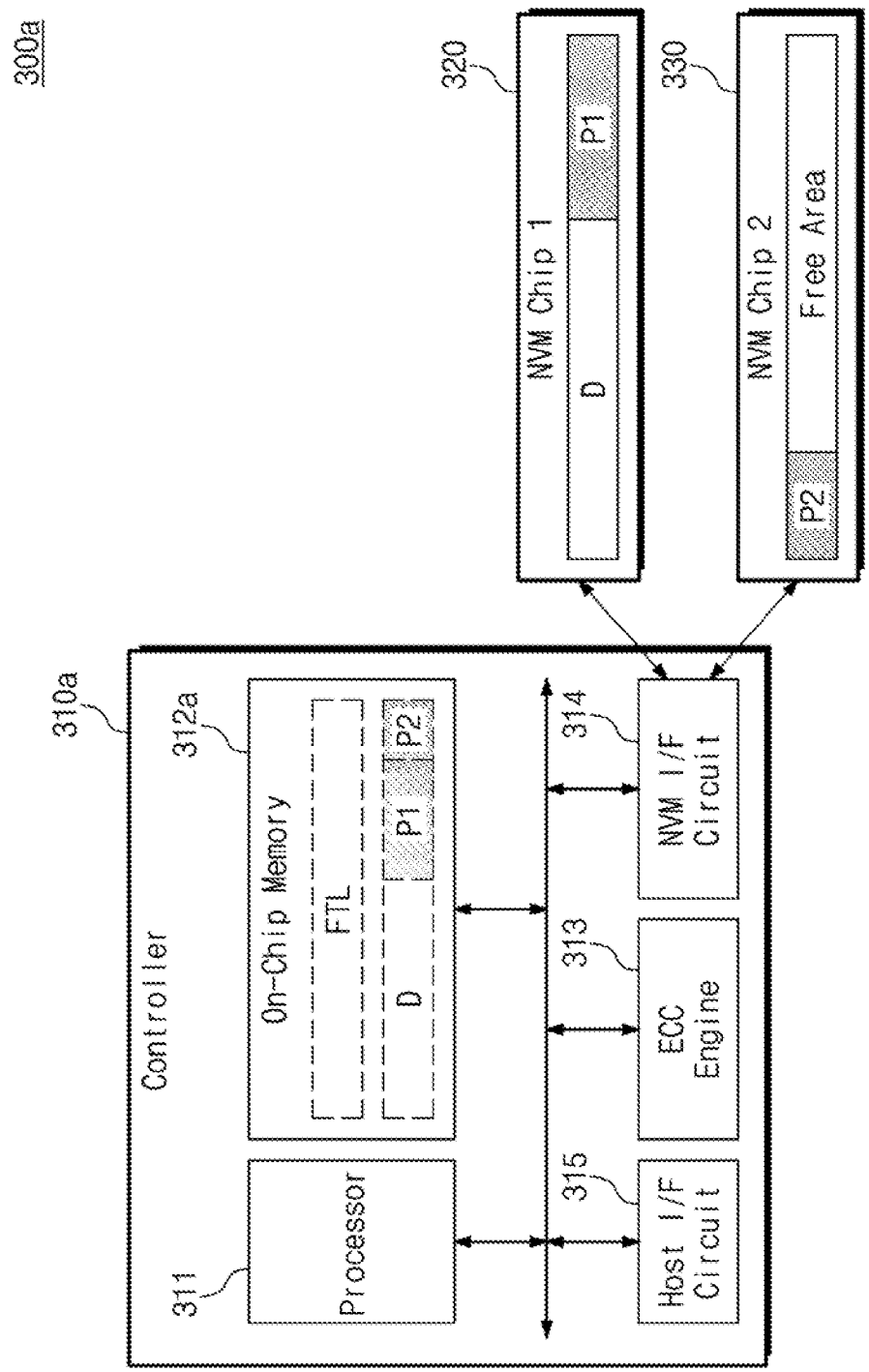
FIGS. 4A and 4B illustrate block diagrams of a storage device of FIG. 1.
Figure 4B:
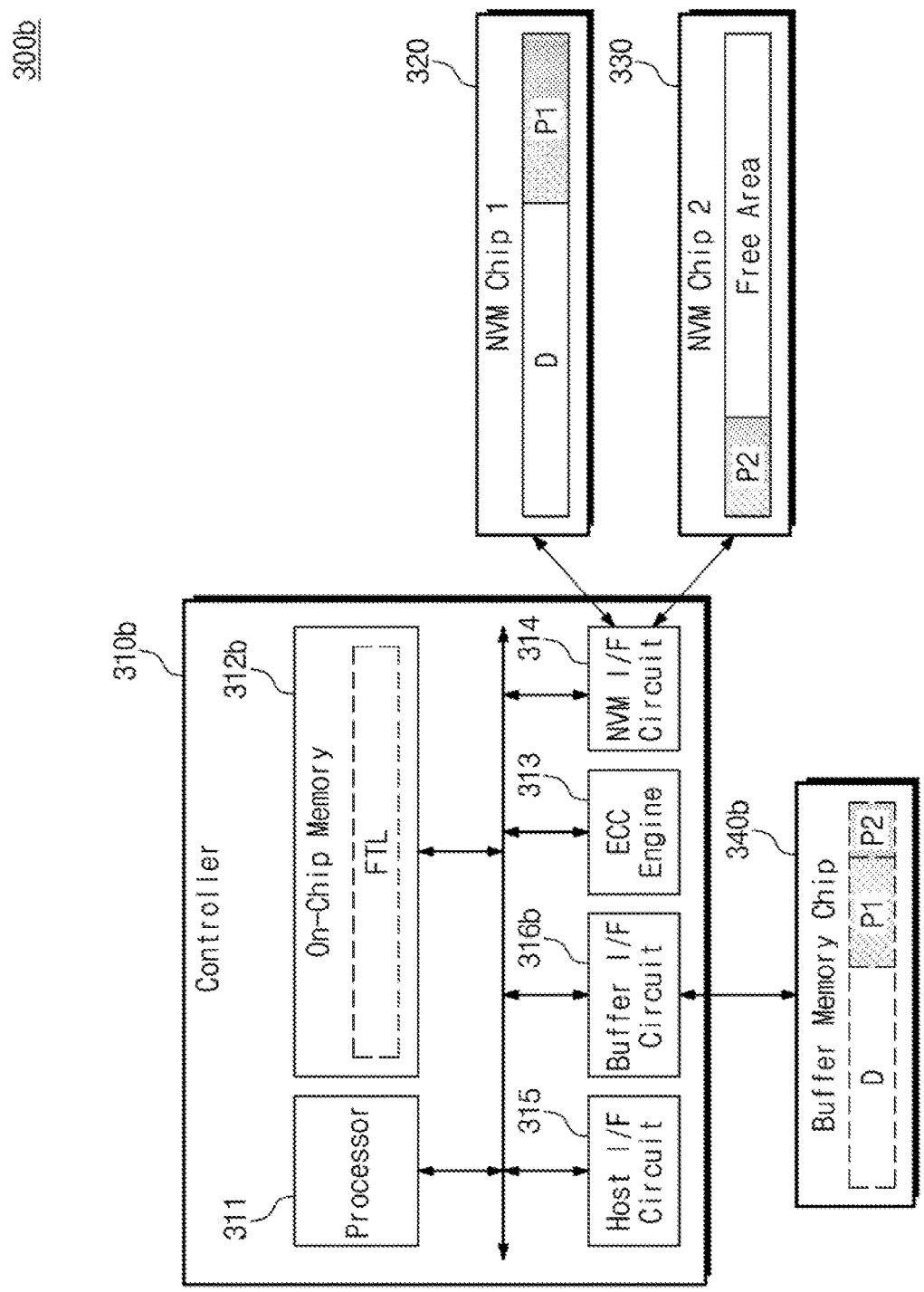

FIGS. 4A and 4B illustrate block diagrams of a storage device of FIG. 1.

Each of storage devices 300a and 300b is an example of the storage device 100 of FIG. 1, a first NVM chip 320 is an example of the first NVM chip 120 of FIG. 1, and a second NVM chip 330 is an example of the second NVM chip 130 of FIG. 1.

In FIGS. 4A and 4B, with regard to components having the same reference numerals as the components illustrated in FIGS. 1, 2A to 2D, and FIGS. 3A and 3B, additional description will be omitted to avoid redundancy. The following description will focus on differences between the respective embodiments of FIGS. 4A and 4B and FIGS. 3A and 3B.

Configurations and operations of components 311, 313, and 314 of a controller 310a/310b may be substantially identical to the configurations and the operations of the components 211, 213, and 214a/214b of the controller 210a/210b described above. The controller 310a/310b may further include a host I/F circuit 315. The host I/F circuit 315 may communicate with the host 11 in compliance with an interface protocol. For example, the interface protocol may be universal serial bus (USB), small computer system interface (SCSI), peripheral component interconnect express (PCIe), mobile PCIe (M-PCIe), nonvolatile memory express (NVMe), advanced technology attachment (ATA), parallel ATA (PATA), serial ATA (SATA), serial attached SCSI (SAS), integrated drive electronics (IDE), universal flash storage (UFS), Firewire, etc.

The processor 311 may temporarily store the data "D" to be stored in the first NVM chip 320 in an on-chip memory 312a. The ECC engine 313 may perform an encoding operation on the data "D" and may temporarily store the parity bits P1 and P2 (as described above, P2 being selectively generated depending on a PE cycle) in the on-chip memory 312a. Also, the ECC engine 313 may perform an encoding operation on the data "D" and may further temporarily store the parity bits P2 in the on-chip memory 312a. The processor 311 may provide the NVM I/F circuit 314 with the data "D" and the parity bits P1 and P2 stored in the on-chip memory 312a. As compared to the example illustrated in FIG. 4A, under control of the processor 311, the ECC engine 313 may directly provide the parity bits P1 and P2 to the NVM I/F circuit 314 without passing through the on-chip memory 312a.

The NVM I/F circuit 314 may receive the data "D" and the parity bits P1 and P2 stored in the first and second NVM chips 320 and 330 and may temporarily store the data "D" and the parity bits P1 and P2 in the on-chip memory 312a. The ECC engine 313 may perform an ECC decoding operation on the data "D" stored in the on-chip memory 312a by using the parity bits P1 and P2 stored in the on-chip memory 312a. As compared to the example illustrated in FIG. 4A, under control of the processor 311, the NVM I/F circuit 314 may directly provide the data "D" and the parity bits P1 and P2 to the ECC engine 313 without passing through the on-chip memory 312a. The ECC engine 313 may store the error-corrected data "D" in the on-chip memory 312a. The host I/F circuit 315 may transmit the error-corrected data "D" stored in the on-chip memory 312a to the host 11 under control of the processor 311.

The storage device 300b may further include a buffer memory chip 340b that is separate from the controller 310b. In an example embodiment, the buffer memory chip 340b may have a relatively fast data input/output speed and a relatively small latency compared to the first to second NVM chip 320 or 330, and may be a DRAM chip that is a volatile memory chip. The controller 310b may further include a buffer I/F circuit 316b that communicates with the buffer memory chip 340b or drives the buffer memory chip 340b under control of the processor 311. The buffer I/F circuit 316b may store at least a part of the data "D", the parity bits P1 and P2, and the error-corrected data "D" in the buffer memory chip 340b. Compared with FIG. 4A, a position where the data "D", the parity bits P1 and P2, and the error-corrected data "D" are temporarily stored may be changed from the on-chip memory 312b to the buffer memory chip 340b. Regardless of the cases illustrated in FIGS. 4A and 4B, the data "D", the parity bits P1 and P2, and the error-corrected data "D" may be temporarily stored in the on-chip memory 312b or the buffer memory chip 340b.

Figure 5A:
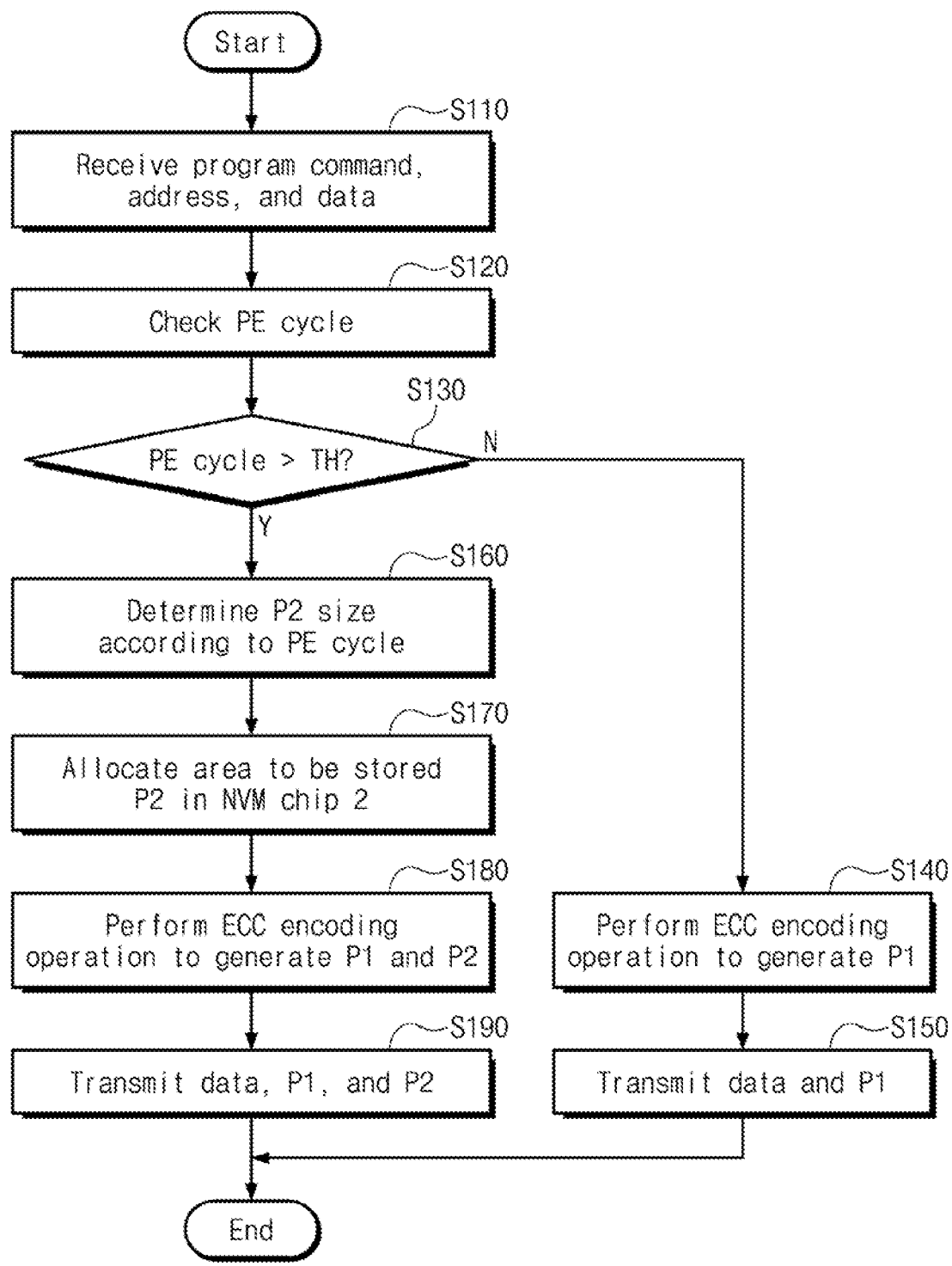
FIGS. 5A and 5B illustrate flowcharts of operating methods of a controller according to an example embodiment.
Figure 5B:
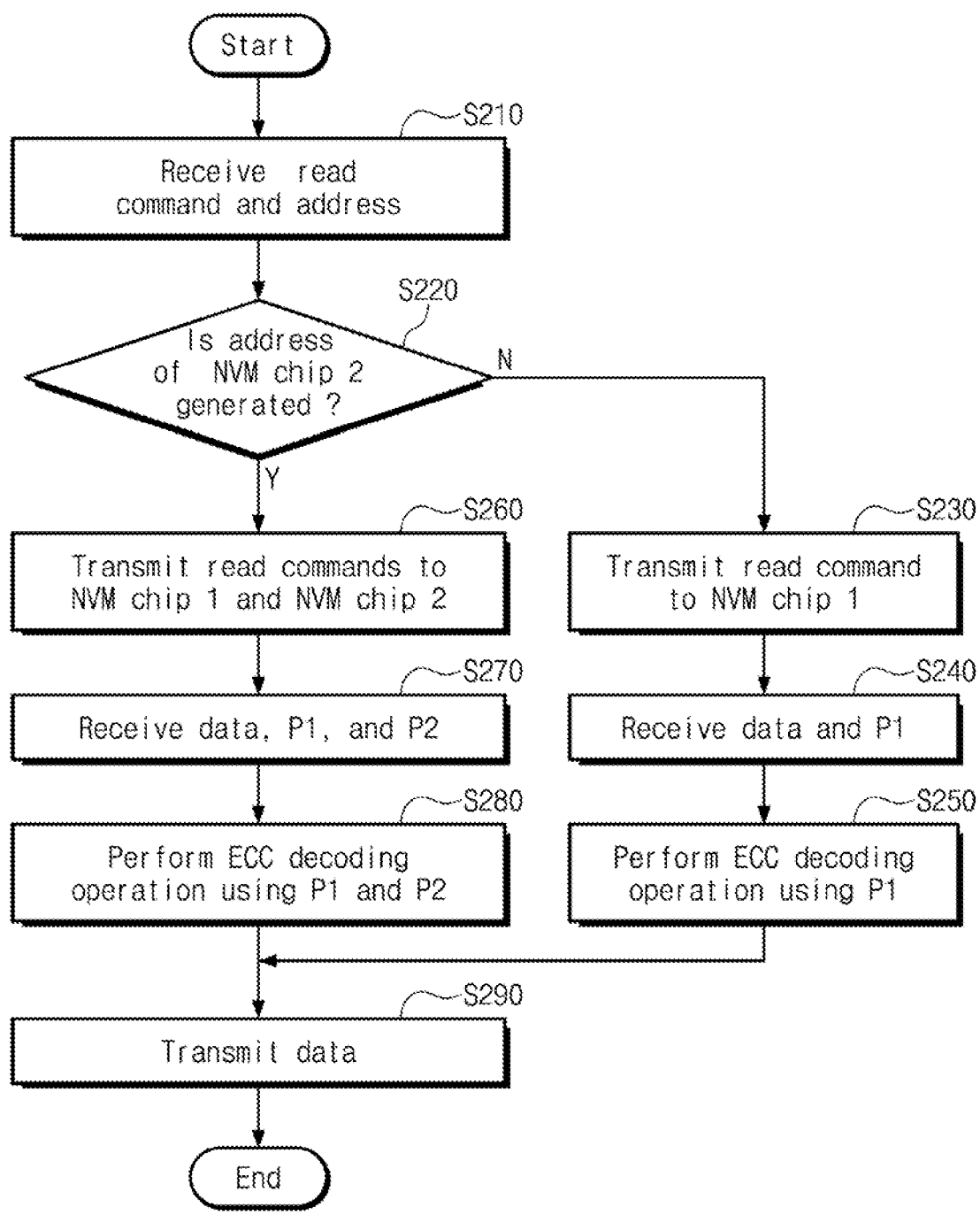

FIGS. 5A and 5B are flowcharts illustrating operating methods of a controller according to an example embodiment.

The controllers 110, 210a, 210b, 310a, and 310b may perform operations of the flowcharts of FIGS. 5A and 5B. A description will be given as the controller 110 performs the operations, as an example.

The flowchart of FIG. 5A may be related to a program operation, and the flowchart of FIG. 5B may be related to a read operation.

First, a program flowchart will be described.

Referring to FIG. 5A, in operation S110, the controller 110 may receive a program command, a logical address, and data from the host 11. The processor 111 may execute the FTL and may translate the logical address received in operation S110 into a physical address of the first NVM chip 120.

In operation S120, the controller 110 may check a PE cycle of a block of the first NVM chip 120, in which the data received in operation S110 will be stored. The PE cycle may be periodically (or randomly) updated at the PE cycle table PET of FIGS. 2A to 2D.

In operation S130, the controller 110 may compare the PE cycle checked in operation S120 with a threshold value TH and determine whether the PE cycle exceeds the threshold value TH (or is the threshold value TH or greater). For example, the threshold value TH of FIG. 5A may be the threshold value X1 of FIG. 2B.

For S130, when the PE cycle does not exceed the threshold value TH (i.e., N), in operation S140, the controller 110 may perform the ECC encoding operation to generate first parity bits (refer to P11 to P41 of FIGS. 2A to 2D and P1 of FIG. 3A to 4B) of data.

In operation S150, the controller 110 may transmit the data and the parity bits to the first NVM chip 120.

For operation S130, when the PE cycle exceeds the threshold value TH (i.e., Y), in operation S160, the controller 110 may variously determine the size of second parity bits (refer to P22 to P42 of FIGS. 2A to 2D and P2 of FIG. 3A to 4B) depending on the PE cycle. For example, the controller 110 may compare the PE cycle with threshold values (e.g., X1 to X3 of FIGS. 2A to 2D), respectively. In the case where the endurance of the first NVM chip 120 relatively decreases as the PE cycle relatively increases, the controller 110 may relatively increase the size of the second parity bits (refer to the sizes of P22, P32, and P42 of FIGS. 2B to 2D). In operation S170, the controller 110 may allocate an area where the second parity bits will be stored, to the second NVM chip 130. The size of the area allocated in operation S170 may be variously determined depending on the size of the second parity bits that are variously determined in operation S160.

In operation S180, the controller 110 may perform the ECC encoding operation to generate the first parity bits and the second parity bits of the data. In operation S190, the controller 110 may transmit the data and the first parity bits to the first NVM chip 120, and may transmit the second parity bits to the second NVM chip 130. The order of operation S110 to S190 of FIG. 5A may be varied. For example, as described, the PE cycle is used in operation S130, operation S160, and operation S170 of FIG. 5A, but another index (e.g., an EP interval or a temperature) indicating the endurance of the first NVM chip 120 may be used.

In operation S210, the controller 110 may receive a read command and a logical address from the host 11. The processor 111 may execute the FTL and may translate the logical address received in operation S210 into a physical address of the first NVM chip 120.

In operation S220, the controller 110 may check whether a physical address of the second NVM chip 130 corresponding to the logical address is generated (or whether a physical address of the second NVM chip 130 corresponding to the logical address is present in the address mapping table AMT). The controller 110 may check whether the second parity bits of the data requested by the read command are generated. In an example embodiment, the processor 111 may determine a physical address indicating an area of the first NVM chip 120 where the data and the first parity bits transmitted in operation S150 are stored, and may update the mapping between the logical address received in operation S110 and the physical address transmitted in operation S150 at the meta data of the FTL (i.e., a mapping table). In another implementation, the processor 111 may determine both a physical address indicating an area of the first NVM chip 120 where the data and the first parity bits transmitted in operation S190 are stored and a physical address indicating an area of the second NVM chip 120 where the second parity bits transmitted in operation S190 are stored, and may update the mapping between the logical address received in operation S110 and the physical addresses transmitted in operation S190 at the meta data of the FTL (i.e., a mapping table). With reference to the mapping table, the controller 110 may check whether the physical address corresponding to the logical address received in operation S210 indicates only the area of the first NVM chip 120, or whether the physical addresses corresponding to the logical address received in operation S210 correspond to the areas of the first and second NVM chips 120 and 130, respectively.

For operation S220, when the physical address of the second NVM chip 130 corresponding to the logical address is not generated (i.e., N), in operation S230, the controller 110 may transmit a read command only to the first NVM chip 120. In operation S240, the controller 110 may receive the data and the first parity bits from the first NVM chip 120. In operation S250, the controller 110 may perform the ECC decoding operation on the data by using the first parity bits and may correct an error of the data.

For operation S220, when the physical address of the second NVM chip 130 corresponding to the logical address is generated (i.e., Y), in operation S260, the controller 110 may transmit the read commands to the first NVM chip 120 and the second NVM chip 130, respectively. In operation S270, the controller 110 may receive the data and the first parity bits from the first NVM chip 120, and may receive the second parity bits from the second NVM chip 130. In operation S280, the controller 110 may perform the ECC decoding operation on the data by using the first parity bits and the second parity bits and may correct an error of the data. In operation S290, the controller 110 may transmit the data obtained in operation S250 or operation S280 to the host 11. The controller 110 may process the read command received in operation S210 as completion.

Figure 6:
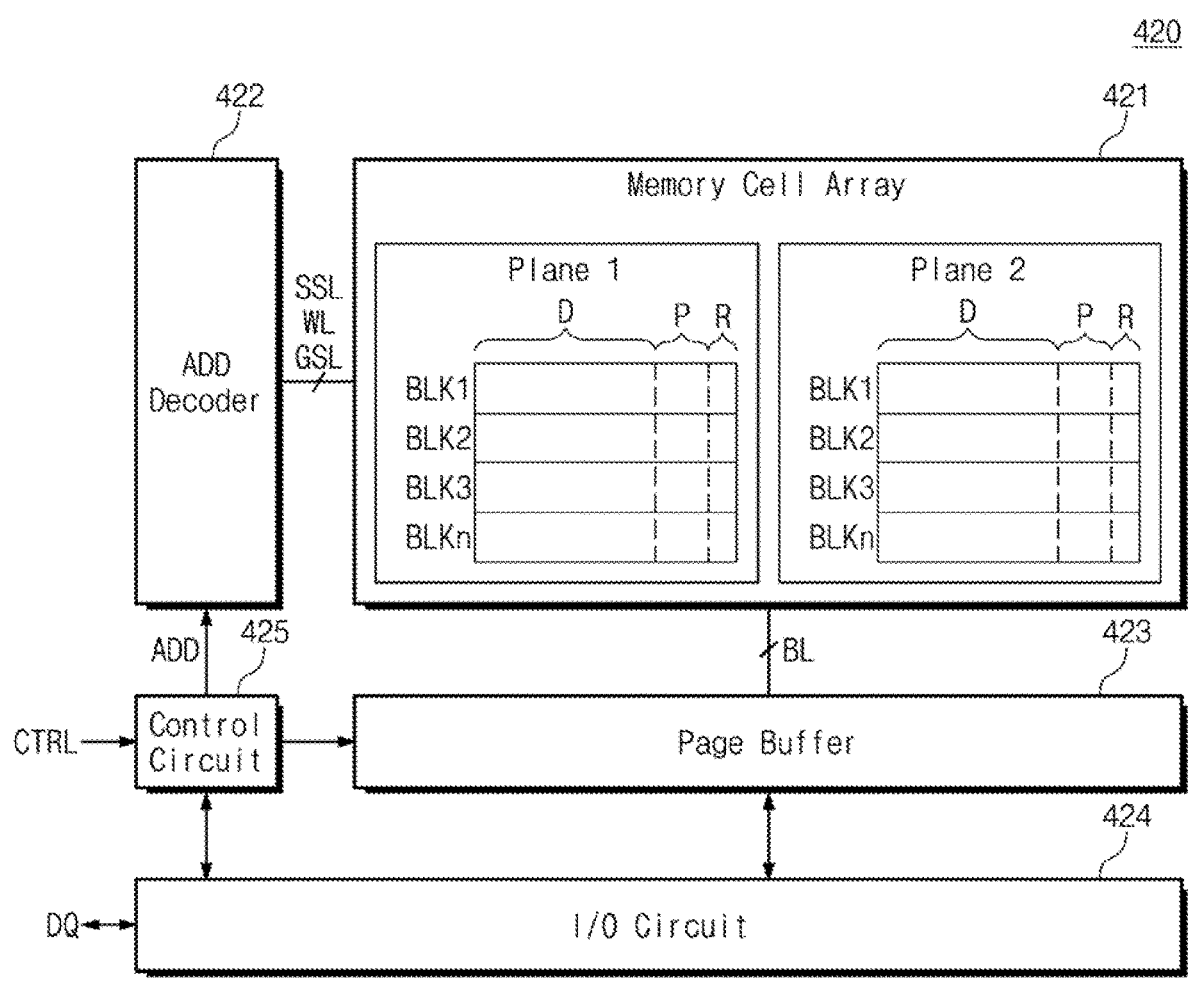
FIG. 6 illustrates a block diagram of a first NVM chip of FIG. 1.

FIG. 6 illustrates a block diagram of a first NVM chip of FIG. 1.

Referring to FIG. 6, a first NVM chip 420 may be an example of the first NVM chip 120 or the second NVM chip 130 described above. The number of bits stored in a memory cell of the first NVM chip 420 used as the first NVM chip 120 may be more than the number of bits stored in a memory cell of the first NVM chip 420 used as the second NVM chip 130. The first NVM chip 420 may include a memory cell array 421, an address decoder 422, a page buffer 423, an I/O circuit 424, and a control circuit 425.

The memory cell array 421 may be divided into one or more planes, e.g., Plane 1 and Plane 2. Each of the planes may include blocks BLK1 to BLKn (n being a natural number of 1 or more). A plane may be also referred to as a "mat". Each of the planes may include memory cells. Data stored in the memory cells of each plane may be simultaneously erased by an erase command. Each of the planes may include memory cells storing the data "D", memory cells storing parity bits (refer to P11 to P41 of FIGS. 2A to 2D and P1 of FIG. 3A to 4B), and memory cells used for a repair "R". The memory cells may be connected to one or more word lines, and memory cells connected to one word line may constitute one page being a program/read unit. A memory cell of the memory cell array 421 may be a NAND flash memory cell.

In an example embodiment, the memory cell array 421 may include a three-dimensional memory array. The three-dimensional (3D) memory array may be monolithically formed in one or more physical level(s) of a memory cell array having an active area arranged with an associated circuit for operation of memory cells on a silicon substrate. The circuit associated with an operation of memory cells may be located in a substrate or on the substrate. The term "monolithic" means that layers of each level of the array are directly deposited on the layers of each underlying level of the array. The 3D memory array may include vertical NAND strings that are vertically oriented such that at least one memory cell is located over another memory cell. The at least one memory cell may include a charge trap layer. Each vertical NAND string may include at least one selection transistor located over the memory cells. At least one selection transistor may have the same structure as memory cells, and be monolithically formed together with memory cells. The following patent documents, which are hereby incorporated by reference, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

In the present example embodiment, the address decoder 422 is connected to the memory cell array 421 through word lines WL, string selection lines SSL, and ground selection lines GSL. The address decoder 422 may decode a physical address ADD from the controller 110 and may drive the word lines WL. The address decoder 422 may select at least one of the word lines WL. The page buffer 423 is connected to the memory cell array 421 through bit lines BL. Under control of the control circuit 425, the page buffer 423 may drive the bit lines BL such that data received from the I/O circuit 424 are stored in the memory cell array 421 in units of a page. Under control of the control circuit 425, the page buffer 423 may read data stored in the memory cell array 421 through the bit lines BL and may provide the read data to the I/O circuit 424. The I/O circuit 424 may receive data through at least one data input/output (DQ) signal and may provide the data to the page buffer 423. The I/O circuit 424 may exchange data with an external device (e.g., the controller 110 of FIG. 1) or may exchange data with the page buffer 423.

The control circuit 425 may receive at least one control signal CTRL from the controller 110, and may decode a command (e.g., a program command, an erase command, or a read command) included in the at least one control signal CTRL or the at least one data input/output signal. The control circuit 425 may control the address decoder 422, the page buffer 423, and the I/O circuit 424. The control circuit 425 may generate various voltages (e.g., a program voltage, a precharge voltage, a pass voltage, a read voltage, an erase voltage, and a verify voltage) that are used to operate the first NVM chip 420. The control circuit 425 may provide the generated voltages to the address decoder 422 or to a substrate of the memory cell array 421.

Figure 7:
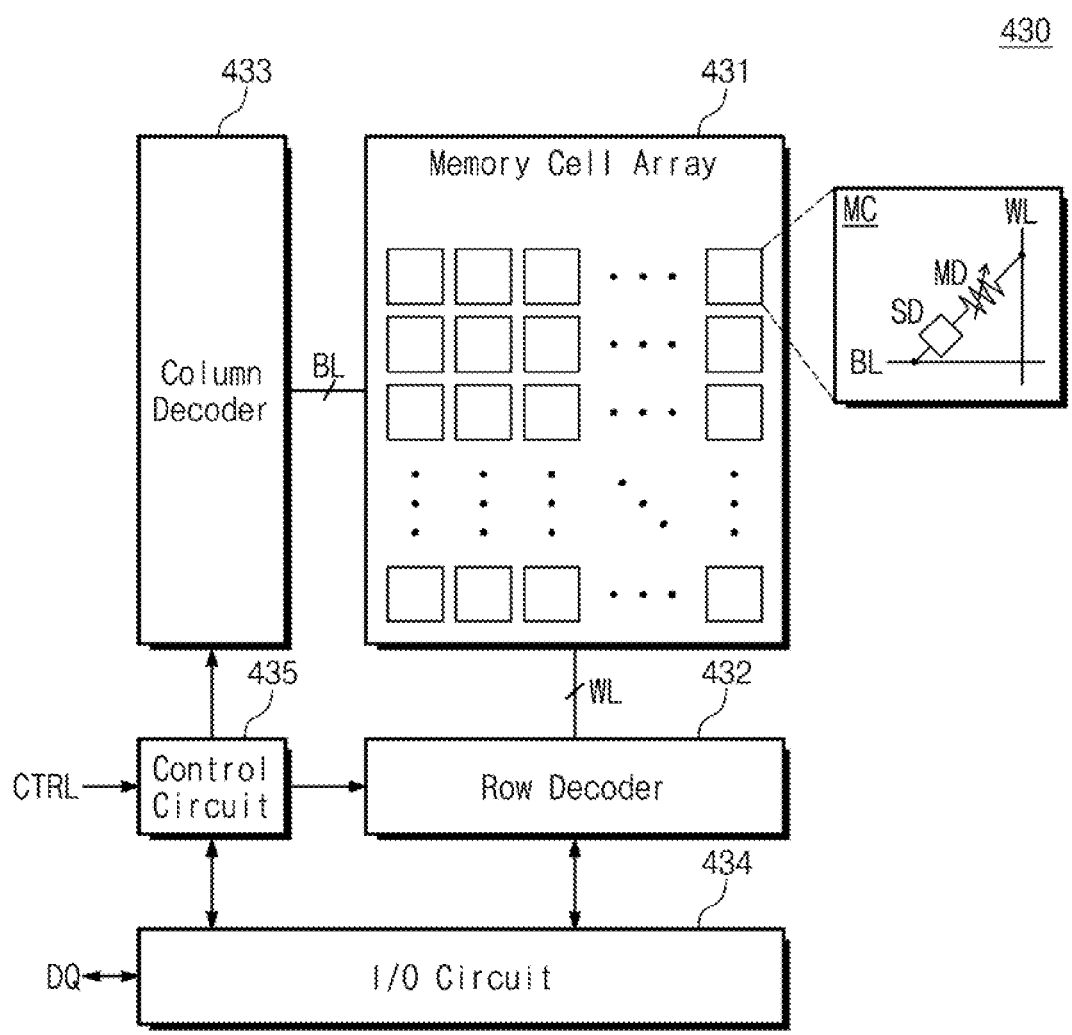
FIG. 7 illustrates a block diagram of a second NVM chip of FIG. 1.

FIG. 7 illustrates a block diagram of a second NVM chip of FIG. 1.

Referring to FIG. 7, a second NVM chip 430 may be an example of the second NVM chip 130 described above. The second NVM chip 430 may include a memory cell array 431, a row decoder 432, a column decoder 433, an I/O circuit 434, and a control circuit 435.

The memory cell array 431 includes memory cells MC. The memory cell MC may include a resistive memory (storage) element MD and a selection element SD. The resistive memory element MD may include a phase change material. The phase change material may have a high resistance state corresponding to an amorphous state or a low resistance state corresponding to a crystalline state, depending on an electrical signal, Joule heating, or a temperature applied to the memory cell MC. For example, the resistive memory element MD may include a chalcogenide material. The selection element SD may be connected in series to the resistive memory element MD. The selection element SD may be, for example, a diode element or an ovonic threshold switch (OTS) element having a bidirectional characteristic. The selection element SD may have a threshold switching characteristic that is nonlinear and has an S-shaped I-V curve. For example, the selection element SD may include a chalcogenide material. In another implementation, the order of connecting the selection element SD and the resistive memory element MD may be opposite to the example illustrated in FIG. 7. The memory cell MC of the memory cell array 431 may be a PRAM cell. The memory cell MC may be disposed or placed at a cross point of a word line WL and a bit line BL.

The row decoder 432 may be connected to the memory cell array 431 through the word lines WL. The column decoder 433 may be connected to the memory cell array 431 through the bit lines BL. The row decoder 432 and the column decoder 433 may decode a physical address from the controller 110 and may respectively drive the word lines WL and the bit lines BL depending on a program command or a read command. For example, the row decoder 432 may select at least one of the word lines WL, and the column decoder 433 may select at least one of the bit lines BL. Under control of the control circuit 435, the row decoder 432 and the column decoder 433 may drive the word lines WL and the bit lines BL such that data received from the I/O circuit 434 are stored in the memory cell array 431 in units of a page. To read data stored in the memory cell array 421, the column decoder 433 may drive the bit lines BL under control of the control circuit 435. In this case, under control of the control circuit 435, the row decoder 432 may read data stored in the memory cell array 421 in units of a page and may provide the read data to the I/O circuit 434. The I/O circuit 434 may receive data through the at least one data input/output (DQ) signal and may provide the data to the row decoder 432 or the column decoder 433. Under control of the control circuit 435, the I/O circuit 424 may exchange data with an external device (e.g., the controller 110 of FIG. 1) or may exchange data with the row decoder 432 or the column decoder 433.

The control circuit 435 may receive the at least one control signal CTRL from the controller 110 and may decode a command (e.g., a program command, an erase command, or a read command) included in the at least one control signal CTRL or the at least one data input/output signal. The control circuit 435 may control the row decoder 432, the column decoder 433, and the I/O circuit 434. The control circuit 435 may generate various voltages (e.g., a program voltage, a precharge voltage, a pass voltage, a read voltage, an erase voltage, and a verify voltage) that are used to operate the second NVM chip 430. The control circuit 435 may provide the row decoder 432 and the column decoder 433 with the generated voltages.

Figure 8:
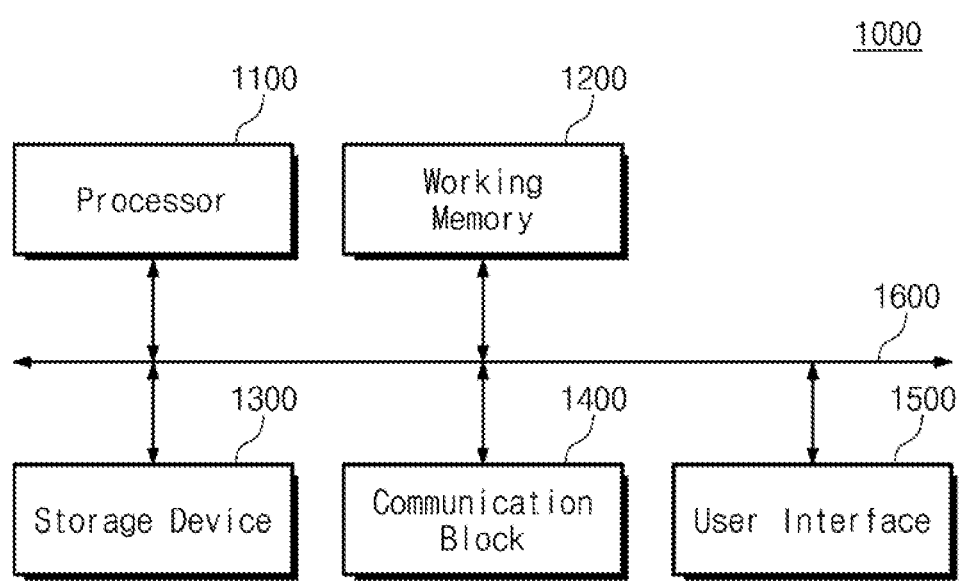
FIGS. 8 to 9 illustrate block diagrams of electronic devices including a storage device according to an example embodiment.
Figure 9:
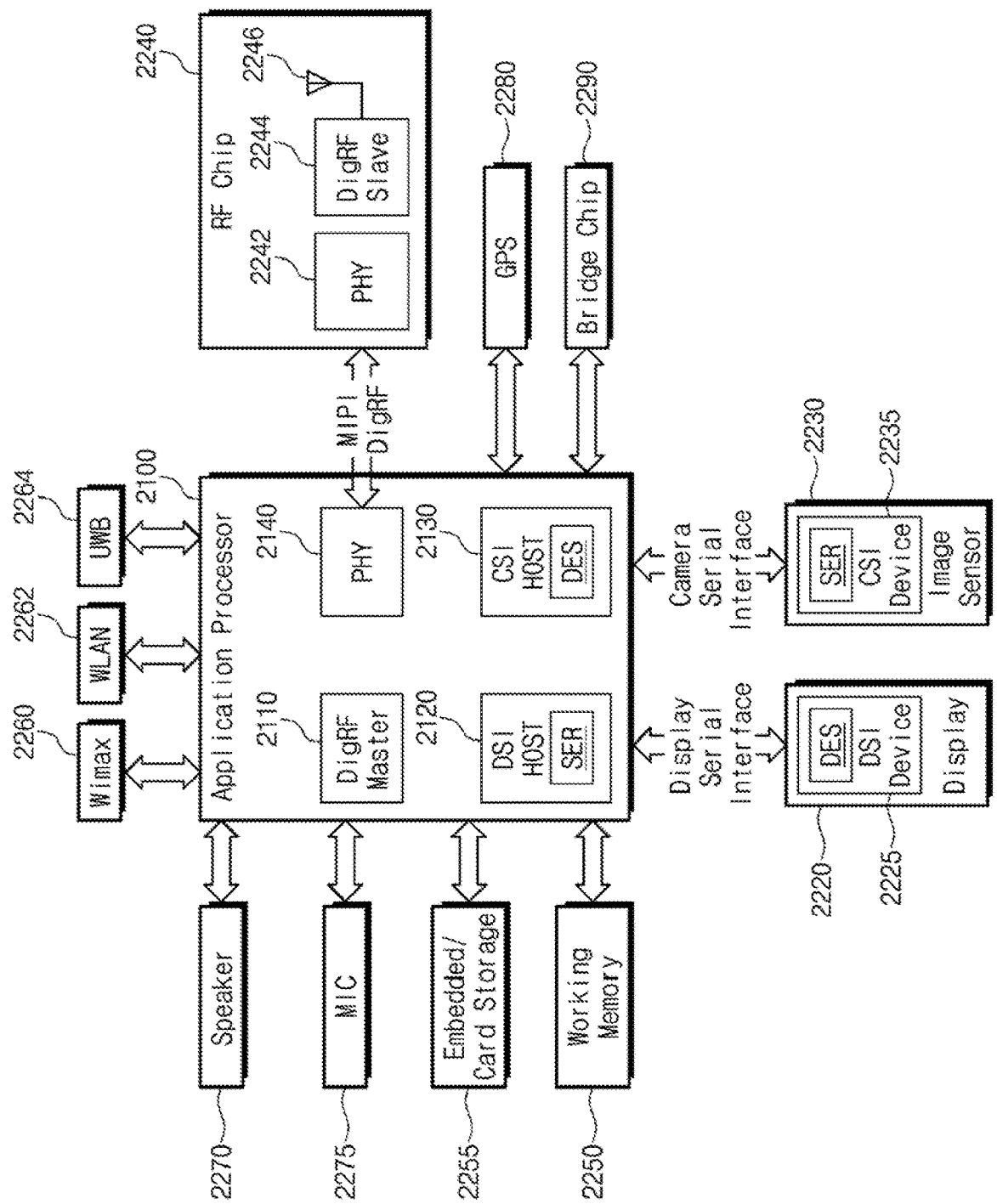

FIGS. 8 to 9 are block diagrams illustrating electronic devices to which a store device according to an example embodiment is applied.

Each of electronic devices 1000 and 2000 may be referred to as a "computing system", a "memory system", an "electronic system", or a "communication system". For example, each of the electronic devices 1000 and 2000 may be a desktop computer, a laptop computer, a tablet computer, a mobile device, a smartphone, a personal digital assistant (PDA), a portable multimedia player (PMP), a wearable device, a video game console, a workstation, a server, a data processing device capable of using or supporting an interface protocol proposed by the mobile industry processor interface (MIPI) alliance, home appliances, a black box, a drone, etc.

Referring to FIG. 8, the electronic device 1000 may include a processor 1100, a working memory 1200, a storage device 1300, a communication block 1400, a user interface 1500, and a bus 1600. The working memory 1200 and the storage device 1300 may exchange data with the processor 1100. The working memory 1200 may be used as a buffer or a cache of the electronic device 1000. The storage device 1300 may store data regardless of whether a power is supplied. The storage device 1300 may be the storage device 100 described above. The communication block 1400 may communicate with the outside of the electronic device 1000. The user interface 1500 may allow a user to communicate with the electronic device 1000. The bus 1600 may provide a communication path between the components of the electronic device 1000.

Referring to FIG. 9, the electronic device 2000 may include an application processor 2100, a display 2220, and an image sensor 2230. The application processor 2100 may include a DigRF master 2110, a display serial interface (DSI) host 2120, a camera serial interface (CSI) host 2130, and a physical layer 2140. The DSI host 2120 may communicate with a DSI device 2225 of the display 2220 through the DSI. For example, a serializer SER may be implemented in the DSI host 2120, and a deserializer DES may be implemented in the DSI device 2225. The CSI host 2130 may communicate with a CSI device 2235 of the image sensor 2230 through a CSI. A deserializer DES may be implemented in the CSI host 2130, and a serializer SER may be implemented in the CSI device 2235. The electronic device 2000 may further include a radio frequency (RF) chip 2240 that communicates with the application processor 2100. The RF chip 2240 may include a physical layer 2242, a DigRF slave 2244, and an antenna 2246. For example, the physical layer 2242 and the physical layer 2140 may exchange data with each other through a DigRF interface proposed by the MIPI alliance. The electronic device 2000 may further include a working memory 2250 and an embedded/card storage device 2255. The working memory 2250 and the embedded/card storage device 2255 may store or output data associated with the application processor 2100. The embedded/card storage device 2255 may be the storage device 100 described above. The embedded storage device 2255 may be embedded in the electronic device 2000, and the card storage device 2255 that is a removable device may be mounted on the electronic device 2000. The electronic device 2000 may communicate with an external device/system through a communication module, such as a worldwide interoperability for microwave access (WiMAX) 2260, a wireless local area network (WLAN) 2262, or an ultra-wideband (UWB) 2264. The electronic device 2000 may further include a speaker 2270, a microphone 2275, a global positioning system (GPS) device 2280, and a bridge chip 2290.

By way of summation and review, integrity of data stored in memory cells of a storage device may become less secure as memory cells are miniaturized and stacked, the memory cells degrade, and the endurance of the memory cells decreases. Also, as the number of bits stored per memory cell increases, the endurance of the memory cells may be impacted.

Parity bits based on an error correction code may be used to correct an error that occurs at data stored in a memory cell, and increasing the number of parity bits may enhance error correction. However, if parity bits are stored together with data, and the number of parity bits stored with the data increases, the size of a memory cell array in which data and parity bits are stored may likewise increase so as to an increase chip size.

As described above, a controller of a storage device according to an example embodiment may store additional parity bits in a second NVM chip, rather than a first NVM chip, for reinforcing an error correction capacity for data stored in the first NVM chip. Accordingly, the controller may prevent the size of the first NVM chip from increasing as much as the size of the additional parity bits, and may dynamically use the second NVM chip.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A storage device, comprising:
a first nonvolatile memory chip;
a second nonvolatile memory chip; and
a controller, wherein the controller includes:
a processor to execute a flash translation layer (FTL) loaded onto an on-chip memory;
an ECC engine to generate first parity bits for first data and to selectively generate second parity bits for the first data, under control of the processor; and
a nonvolatile memory interface circuit to transmit the first data and the first parity bits to the first nonvolatile memory chip, and to selectively transmit the second parity bits selectively generated to the second nonvolatile memory chip such that the first data is stored in the first nonvolatile memory chip and at least some ECC data for error correction of the first data are selectively stored as the second parity bits in the second nonvolatile memory chip.

2. The storage device as claimed in claim 1, wherein the processor is to check a program-erase (PE) cycle of memory cells of the first nonvolatile memory chip in which the first data are stored, and to determine whether to generate the second parity bits depending on the PE cycle.

3. The storage device as claimed in claim 2, wherein the processor is to determine a size of the second parity bits depending on the PE cycle.

4. The storage device as claimed in claim 1, wherein the ECC engine is to perform a first ECC decoding operation on the first data by using the first parity bits when the second parity bits are not generated, and to perform a second ECC decoding operation on the first data by using both the first parity bits from the first nonvolatile memory chip and the second parity bits from the second nonvolatile memory chip when the second parity bits are generated.

5. The storage device as claimed in claim 1, wherein:
the first nonvolatile memory chip includes a first area storing the first data and the first parity bits,
the second nonvolatile memory chip includes a second area storing the second parity bits when the second parity bits are generated, and
when the second parity bits are not generated, the processor is to set the second area to a third area, the third area being an area that is not accessed by an external device or in which different data from the first data are stored.

6. The storage device as claimed in claim 5, wherein the third area is used for garbage collection, is used as an over-provisioning area, is used to store meta data of the FTL, or is used to store firmware.

7. The storage device as claimed in claim 1, wherein a maximum PE cycle of a memory cell of the second nonvolatile memory chip is greater than a maximum PE cycle of a memory cell of the first nonvolatile memory chip.

8. The storage device as claimed in claim 1, wherein a data input/output speed of the second nonvolatile memory chip is faster than a data input/output speed of the first nonvolatile memory chip, and a data input/output unit of the second nonvolatile memory chip is smaller than a data input/output unit of the first nonvolatile memory chip.

9. The storage device as claimed in claim 1, wherein a number of bits stored in a memory cell of the first nonvolatile memory chip is larger than a number of bits stored in a memory cell of the second nonvolatile memory chip.

10. The storage device as claimed in claim 1, wherein the first nonvolatile memory chip is a NAND flash memory chip, and the second nonvolatile memory chip is a PRAM chip.

11. A storage device, comprising:
a first nonvolatile memory chip;
a second nonvolatile memory chip; and
a controller including a processor and an ECC engine, wherein:
the ECC engine is to generate first parity bits for first data to be stored in the first nonvolatile memory chip, and to selectively generate second parity bits for the first data, under control of the processor,
the first data and first parity bits are to be stored in the first nonvolatile memory chip, and the processor is to selectively allocate an area, in which the second parity bits selectively generated are to be stored, to the second nonvolatile memory chip such that the first data is stored in the first nonvolatile memory chip and at least some ECC data for error correction of the first data are selectively stored as the second parity bits in the second nonvolatile memory chip.

12. The storage device as claimed in claim 11, wherein the processor is to determine, depending on a program-erase (PE) cycle of memory cells of the first nonvolatile memory chip, whether to generate the second parity bits and whether to allocate the area at which the first data are stored.

13. The storage device as claimed in claim 12, wherein, the processor is to determine a size of the second parity bits, and to adjust the area allocated to the second nonvolatile memory chip depending on the size of the second parity bits based on determining that the second parity bits are generated.

14. The storage device as claimed in claim 13, wherein the size of the second parity bits is 10% or more of a size of the first parity bits.

15. The storage device as claimed in claim 12, wherein, based on a determination that the second parity bits are not generated depending on the PE cycle, the processor is to allocate to the second nonvolatile memory chip, instead of the area where the second parity bits are stored, one or more of: a garbage collection area for garbage collection, an over-provisioning area, an area to store meta data of a flash translation layer (FTL), or an area to store firmware.

16. The storage device as claimed in claim 11, wherein:
the first nonvolatile memory chip is to store the first data and the first parity bits transmitted through a first channel connected to the controller, and
when the second parity bits are generated, the second nonvolatile memory chip is to store the second parity bits transmitted through one of the first channel and a second channel connected to the controller in the area.

17. The storage device as claimed in claim 16, further comprising a buffer memory chip to store the first data and the first parity bits transmitted from the first nonvolatile memory chip and to store the second parity bits transmitted from the second nonvolatile memory chip,
wherein the ECC engine is to perform an ECC decoding operation on the first data stored in the buffer memory chip by using the first parity bits and the second parity bits stored in the buffer memory chip.

18. A method of operating a storage device that includes a first nonvolatile memory chip, a second nonvolatile memory chip, and a controller, the method comprising:
checking, by the controller, a program-erase (PE) cycle of memory cells of the first nonvolatile memory chip, in which first data and first parity bits for the first data are stored; and
selectively generating, by the controller, second parity bits for the first data, in addition to the first parity bits, depending on the PE cycle; and
storing the first data in the first nonvolatile memory chip, and selectively storing at least some ECC data for error correction of the first data as the second parity bits in the second nonvolatile memory chip.

19. The method as claimed in claim 18, further comprising transmitting, by the controller, the first data and the first parity bits to the first nonvolatile memory chip when the second parity bits are not generated.

20. The method as claimed in claim 18, further comprising transmitting, by the controller, the first data and the first parity bits to the first nonvolatile memory chip and the second parity bits to the second nonvolatile memory chip when the second parity bits are generated.

* * * * *